United States Patent [19]

Motonami

[11] Patent Number: 5,614,745
[45] Date of Patent: Mar. 25, 1997

[54] CONTACT STRUCTURE BETWEEN TWO CONDUCTIVE LAYERS IN SEMICONDUCTOR DEVICE AND METHOD OF MANUFACTURING THE SAME

[75] Inventor: Kaoru Motonami, Hyogo-ken, Japan

[73] Assignee: Mitsubishi Denki Kabushiki Kaisha, Tokyo, Japan

[21] Appl. No.: 355,332

[22] Filed: Dec. 12, 1994

Related U.S. Application Data

[63] Continuation of Ser. No. 932,207, Aug. 19, 1992, abandoned.

[30] Foreign Application Priority Data

Aug. 30, 1991 [JP] Japan .................................. 3-220276
Feb. 5, 1992 [JP] Japan .................................. 4-020204

[51] Int. Cl.$^6$ .......................... H01L 29/76; H01L 29/94; H01L 31/062
[52] U.S. Cl. .......................... 257/296; 257/384; 257/639; 257/649; 257/755; 257/766
[58] Field of Search .................................. 257/296, 310, 257/639, 640, 649, 384, 755, 760

[56] References Cited

U.S. PATENT DOCUMENTS

| 5,017,979 | 5/1991 | Fujii et al. | 257/319 |
| 5,063,423 | 11/1991 | Fujii et al. | 257/316 |
| 5,150,179 | 9/1992 | Gill | 257/390 |

FOREIGN PATENT DOCUMENTS

0174773A2  3/1986  European Pat. Off. .

OTHER PUBLICATIONS

Chang et al., "Specific Contact Resistance of Metal–Semiconductor Barriers", Solid–State Electronics Pergamon Press 1971, vol. 14, pp. 541–550.

Hideaki Arima et al., Japanese Journal of Applied Physics, vol. 30, No. 3A, 1991, pp. L 334 to 337.

Hyunsang Hwang et al., Appl. Phys. Lett. 57(10), 1990, pp. 1010 to 1011.

Moslehi et al., Appl. Phys. Lett. 47(10), 1985, pp. 1113 to 1115.

Manabu Ando et al., IEEE Journal of Solid–State Circuits, vol. 24, No. 6, 1989, pp. 1708 to 1713.

B.E. Deal, "Vapor Phase Wafer Cleaning and Integrated Processing Technology for the 1990's" 1990 Proceedings—Institute of Environmental Sciences. pp. 1–6.

*Primary Examiner*—Ngân V. Ngô
*Attorney, Agent, or Firm*—Lowe, Price, LeBlanc & Becker

[57] ABSTRACT

A semiconductor device has a contact structure between two conductive layers capable of effectively preventing growth of an oxide film and diffusion of impurities between an impurity diffused region in a first one of the conductive layers and a polycrystalline silicon film (the second conductive layer) formed to be in contact with the impurity diffused region. The contact structure between the two conductive layers includes an n-type impurity diffused region 3 formed on a silicon substrate 1, an nitrided oxide film 4 formed to be in contact with the n-type impurity diffused region 3, and a polycrystalline silicon film 5a formed on the nitrided oxide film 4 and doped with impurities. Accordingly, growth of an oxide film and diffusion of impurities between the n-type impurity diffused region 3 and the polycrystalline silicon film 5a are also effectively prevented in a case where heat treatment at a high temperature is subsequently carried out in an oxygen atmosphere.

17 Claims, 26 Drawing Sheets

R(mean): MEAN OF CONTACT RESISTANCE [Ω]
R Variance): VARIANCE OF CONTACT RESISTANCE [Ω]
S: CONTACT AREA [μm²]

R(Variance): VAIANCE OF CONTACT RESISTANCE [Ω]

REMOVAL OF NATURAL OXID FILM (IN VACUUM)

CONTACT STRUCTURE BETWEEN TWO CONDUCTIVE LAYERS IN SEMICONDUCTOR DEVICE AND METHOD OF MANUFACTURING THE SAME

This application is a continuation of Application Ser. No. 07/932,207 filed Aug. 19, 1992 now abandoned.

BACKGROUND OF THE INVENTION

1. Field of the Invention

The present invention relates to a contact structure between two conductive layers in a semiconductor device and a method of manufacturing the same, and, more particularly, to a contact structure making two conductive layers in contact through an insulating layer having an opening and a method of manufacturing the same.

2. Description of the Background Art

So far a dynamic random access memory (DRAM) capable of randomly inputting/outputting data is known as a semiconductor device.

FIG. 23 is a sectional structure view for describing contact structure for interconnection in a conventional DRAM. Referring to FIG. 23, a DRAM includes a silicon substrate 41, thick isolating oxide films 43 formed spaced a predetermined distance away from each other on silicon substrate 41, n-type impurity diffused regions 49 formed on silicon substrate 41 between thick oxide films 43 and each forming a source/drain of a MOS transistor, n-type impurity diffused regions 44 formed adjacent to thick isolating oxide films 43, p-type impurity diffused regions 42 formed beneath respective isolating oxide films 43, cell plates 46 each formed on n-type impurity diffused region 44 with a capacitor gate insulating film 45 interposed therebetween, and gate electrodes 48 each formed on silicon substrate 41 between adjacent two n-type impurity diffused regions 49 with a gate oxide film 47 interposed therebetween. The DRAM further includes insulating oxide films 50 formed to cover the whole surface and having a contact hole 50a on one of n-type impurity diffused regions 49 constituting a MOS transistor, a polycrystalline silicon film 51a formed to cover insulating oxide films 50 and electrically connected to n-type impurity diffused region 49 in contact hole 50a, a refractory metal silicide film 52 formed on polycrystalline silicon film 51a, an interlayer insulating film 53 formed to cover the whole surface, and aluminum interconnecting layers 54 formed spaced a predetermined distance away from each other on interlayer insulating film 53.

Polycrystalline silicon film 51a is doped with impurities in order to reduce the resistance. n-type impurity diffused regions 44, capacitor gate insulating film 45, and cell plate 46 constitute a capacitor for storing an electric charge corresponding to a data signal. Polycrystalline silicon film 51 and refractory metal silicide film 52 constitute a bit line.

FIGS. 24 to 28 are sectional views for describing a manufacturing process (a first step to a fifth step) of a conventional DRAM illustrated in FIG. 23. FIG. 29 is a plan view of the DRAM in the second step of the manufacturing process illustrated in FIG. 25. FIG. 30 is a plan view of the DRAM in the fifth step of the manufacturing process illustrated in FIG. 28. FIG. 25 illustrates a section taken along line X—X in FIG. 29, and FIG. 28 illustrates a section taken along line X—X in FIG. 30.

Now, referring to FIGS. 23 to 30, a manufacturing process of contact structure for interconnection in a conventional DRAM will be described.

First, as illustrated in FIG. 24, p-type impurity ions are selectively implanted into a p-type silicon substrate 41. Then, p-type impurity diffused region 42 for preventing inversion and a thick isolating oxide film 43 are formed by thermal oxidation. n-type impurity ions are implanted into silicon substrate 41 by an ion implantation process or the like. n-type impurity diffused regions 44 are formed by heat treatment. A thin capacitor gate insulating film 45 is formed by a thermal oxidation process or a chemical vapor deposition process (CVD process). A polycrystalline silicon layer including impurities of a predetermined conductivity type is deposited on capacitor gate insulating film 45 by a CVD process or the like. The polycrystalline silicon layer is selectively removed by a photolithography technique to form a cell plate 46. Thus, a capacitor including n-type impurity diffused regions 44, capacitor gate insulating film 45, and cell plate 46 is formed.

A gate oxide film 47 is formed on p-type silicon substrate 41 by a thermal oxidation process or the like. A single layer of polycrystalline silicon or a two-layer film of polycrystalline silicon and refractory metal silicide layers is deposited on gate oxide film 47 by a CVD process or the like. This film is selectively removed by a photolithography technique. This causes gate electrodes 48 formed spaced a predetermined distance away from each other. Phosphorus ions, which are n-type impurities, are ion-implanted into silicon substrate 41 using gate electrode 48 and cell plate 46 as a mask. n-type impurity diffused layers 49 to be source/drain regions of a MOS transistor are formed by carrying out heat treatment. At this time, one of n-type impurity diffused regions 49 is formed to be connected to n-type impurity diffused region 44 included in a capacitor.

Next, as illustrated in FIG. 25, an insulating oxide film 50 is deposited on the whole surface by a reduced pressure CVD process or the like. Insulating oxide film 50 is selectively removed by a photolithography technique. Contact holes 50a are formed by doing this. Specifically, contact holes 50a are formed by carrying out selective etching by isotropic wet etching and anisotropic reactive ion etching (RIE) using a predetermined resist pattern formed on insulating oxide film 50 as a mask. A planar arrangement of thus formed contact holes 50a is illustrated in FIG. 29.

Next, as illustrated in FIG. 26, a polycrystalline silicon film 51 not doped with impurities is formed on the surface of n-type impurity diffused region 49 in contact hole 50a and the surface of insulating oxide film 50 by a reduced pressure CVD process. Polycrystalline silicon film 51 is formed to have a thickness of 1000 to 1500Å.

Next, as illustrated in FIG. 27, arsenic (As), which is n-type impurities, is diffused in the direction indicated by arrow 55 by an ion implantation process to reduce the resistance of polycrystalline silicon film 51.

Next, as illustrated in FIG. 28, a refractory metal silicide film 52 is formed on polycrystalline silicon film 51a doped with impurities. A bit line is implemented with polycrystalline silicon film 51a and refractory metal silicide film 52. A thick interlayer insulating film 53 is formed to cover the whole surface. A planar arrangement of the bit lines in this state is illustrated in FIG. 30.

Finally, as illustrated in FIG. 23, an aluminum layer is formed on interlayer insulating film 53 by a sputtering process. The aluminum layer is patterned by a photolithography technique. Aluminum interconnecting layers 54 as auxiliary word lines are formed in a direction corresponding to gate electrodes 48 as word lines.

As described above, the conventional contact structure for interconnection of a DRAM had n-type impurity diffused region 49 and polycrystalline silicon film 51a constituting a bit line formed to be electrically connected through contact hole 50a.

However, a problem as described in the following arouse in the conventional contact structure for interconnection. FIGS. 31 to 35 are sectional structure views for describing a formation process (a first step to a fifth step) of the polycrystalline silicon film illustrated in FIG. 26. FIG. 36 is a typical view illustrating a sectional structure of a CVD apparatus for forming the polycrystalline silicon film illustrated in FIG. 34.

Referring to FIGS. 31 to 36, a conventional problem will be described.

First, details of a formation process of the polycrystalline silicon film illustrated in FIG. 26 will be described.

As illustrated in FIG. 31, a contact hole 50a is formed in an insulating oxide film 50 so that a surface part 49a of an n-type impurity diffused region 49 is exposed. The exposed surface part 49a of n-type impurity diffused region 49 reacts with water ($H_2O$) or oxygen ($O_2$) in the air. This causes a natural oxide film 61 to be formed on the surface of n-type impurity diffused region 49 as illustrated in FIG. 32. The thickness of natural oxide film 61 is approximately 10Å.

In a case where a polycrystalline silicon film is deposited on the structure by a CVD process in a state illustrated in FIG. 32, a CVD apparatus as illustrated in FIG. 36 is used. Referring to FIG. 36, a CVD apparatus includes a CVD furnace 71 and heaters 72 arranged in the periphery of CVD furnace 71. In operation, a wafer 73 in a state illustrated in FIG. 32 is inserted into CVD furnace 71 by machinery carriage.

When wafer 73 is inserted into CVD furnace 71 in a conventional CVD apparatus having such structure, outside air is caught in CVD furnace 71 together with wafer 73. The outside air caught therein includes oxygen $O_2$. At this time, the temperature in CVD furnace 71 is a high temperature of at least 400° C. Accordingly, the oxygen $O_2$ caught in CVD furnace 71 and the high temperature atmosphere causes oxidation of the surface of wafer 73 to further proceed. Specifically, the exposed surface of n-type impurity diffused region 49 is further oxidized through natural oxide film 61. As a result, a thick oxide film 62 as illustrated in FIG. 33 is formed on the surface of n-type impurity diffused region 49. The thickness of thick oxide film 62 is approximately 20 to 30Å. A polycrystalline silicon film 51 is formed by a CVD apparatus as illustrated in FIG. 34 on the structure in a state illustrated in FIG. 33. Then, as illustrated in FIG. 35, polycrystalline silicon film 51 (see FIG. 34) is doped with impurities. A polycrystalline silicon film 51a doped with impurities is formed by this. Then, a refractory metal silicide film 52 is formed on polycrystalline silicon film 51a by a sputtering process.

However, there was a problem that it is not possible to obtain satisfactory ohmic contact between n-type impurity diffused region 49 and polycrystalline silicon film 51a in the structure as illustrated in FIG. 35 because there is thick oxide film 62 therebetween. Now, ohmic contact will be described. FIG. 37 is a graph of current/voltage characteristics for describing ohmic contact. Referring to FIG. 37, ohmic contact is contact which makes it possible to obtain a linear proportional relationship between current and voltage. Contact which does not make it possible to obtain such linear proportional relationship is referred to as non-ohmic contact. In a contact structure for interconnection as illustrated in FIG. 35, n-type impurity diffused region 49 and polycrystalline silicon film 51a are brought to an non-ohmic contact state as illustrated in FIG. 37 because of the existence of thick oxide film 62. Thus, it was difficult to obtain a satisfactory ohmic contact between n-type impurity diffused region 49 and polycrystalline silicon film 51a because of thick oxide film 62 which is formed on the surface of n-type impurity diffused region 49 on the occasion of carriage into a CVD apparatus.

So far techniques of removing a naturally oxide film in a vacuum and forming a polycrystalline silicon film in the vacuum by a CVD process have been proposed. These are disclosed, for example, in "Paper presented at the 36th Annual Technical Meeting of the Institute of Environmental Sciences" pp.1–6. FIGS. 38 to 41 are sectional structure views for describing a proposed conventional formation process (a first step to a fourth step) of a polycrystalline silicon film using a CVD process. Referring to FIGS. 38 to 41, the proposed formation process of a polycrystalline silicon film will be simply described. First, as illustrated in FIG. 38, the surface of an n-type impurity diffused region 83 on a main surface of a silicon substrate 81 is exposed by a contact hole 82a formed in an insulating oxide film 82. Then, a natural oxide film 84 is formed on the surface of n-type impurity diffused region 83 in the same manner as the conventional one. Natural oxide film 84 is removed by etching in a vacuum as illustrated in FIG. 39. Then, as illustrated in FIG. 40, a polycrystalline silicon film 85 is formed by a CVD process in the vacuum. Thus, according to the proposed technique, no oxide film is formed between n-type impurity diffused region 83 and polycrystalline silicon film 85 when polycrystalline silicon film 85 is formed by a CVD process. Then, polycrystalline silicon film 85 (See FIG. 40) is doped with impurities, and a silicide film 86 is formed by sputtering as illustrated in FIG. 41. Then, an interlayer insulating film 87 of a PSG or BPSG film or the like is formed on the whole surface.

On the occasion of formation of interlayer insulating film 87, a reflow process in which processing is carried out in oxygen, hydrogen, and a high temperature atmosphere is used for flattening the surface of interlayer insulating film 87. Therefore, oxygen is supplied to the surface of silicon substrate 81, and an oxide film 88 is formed on the interface between silicon substrate 81 and insulating oxide film 82. If oxidation of oxide film 88 further proceeds, an oxide film is also formed on the interface between n-type impurity diffused region 83 and polycrystalline silicon film 85a. As a result, there is a problem that it is difficult to obtain satisfactory ohmic contact between n-type impurity diffused region 83 and impurity doped polycrystalline silicon film 85a. In addition, there is also a problem that high temperature processing on the occasion of formation of interlayer insulating film 87 causes the impurities with which impurity doped polycrystalline silicon film 85a is doped to be diffused into n-type impurity diffused region 83. If impurities are thus diffused from impurity doped polycrystalline silicon film 85a into n-type impurity diffused region 83, there is a problem that the impurity concentration of n-type impurity diffused region 83 changes. The change in the impurities in n-type impurity diffused region 83 cause various problems in a case where elements are miniaturized in accordance with integration of a semiconductor device. Specifically, in a case where n-type impurity diffused region 83 is a source/drain region of a MOS transistor, for example, diffusion of impurities from impurity doped polycrystalline silicon film 85a causes the space between the adjacent other source/drain region and it to be narrow. As a result, a problem that punch through tends to occur is also considered.

Now, a case where a bit line in a DRAM is implemented with only a silicide film will be considered.

FIGS. 42 to 46 are sectional structure views for describing a conventional formation process (a first step to a fifth step) of a silicide film by sputtering. Referring to FIGS. 42 to 46, a process of forming a silicide film to be a bit line by a sputtering process will be simply described.

First, as illustrated in FIG. 42, an n-type impurity diffused region 93 is formed in a predetermined region on the surface of a silicon substrate 91. An insulating oxide film 92 is formed so that a contact hole 92a is provided on a surface part 93a of n-type impurity diffused region 93. In a state in which surface part 93a of n-type impurity diffused region 93 is thus exposed, surface part 93a reacts with water or oxygen in the air. This causes a natural oxide film 94 to be formed as illustrated in FIG. 43. As illustrated in FIG. 44, natural oxide film 94 is removed by sputter etching. Subsequently, a silicide film 95 is formed by sputtering. In the case where a sputtering process is used like this, no oxide film is formed on the interface between silicide film 95 and n-type impurity diffused region 93.

However, if an interlayer insulating film 96 such as a PSG film is formed on silicide film 95 as illustrated in FIG. 46, the same problem as that in the case described with reference to FIG. 41 arises. Specifically, high heat treatment in an oxygen and hydrogen atmosphere on the occasion of formation of interlayer insulating film 96 causes an oxide film 97 to be formed on the interface between silicide film 95 and n-type impurity diffused region 93. There was a problem that this makes it impossible to obtain satisfactory ohmic contact. In addition, there was also a problem that high heat treatment on the occasion of formation of interlayer insulating film 96 causes the impurities in n-type impurity diffused region 93 to be diffused into silicide film 95. If impurities in n-type impurity diffused region 93 are diffused into silicide film 95, the impurity concentration of n-type impurity diffused region 93 is reduced. Therefore, there was a problem that the resistance of the contact between silicide film 95 and n-type impurity diffused region 93 is increased.

As described above, so far it was difficult to obtain satisfactory ohmic contact in contact structure between two conductive layers in a semiconductor device, and it was difficult to effectively prevent change in concentration of an impurity diffused region.

SUMMARY OF THE INVENTION

An object of the present invention is to obtain satisfactory ohmic contact between a first conductive layer and a second conductive layer in contact structure between two conductive layers in a semiconductor device and to effectively prevent change in the impurity concentration in the first conductive layer.

Another object of the present invention is to effectively prevent growth of an oxide film on the interface between a first conductive layer and a second conductive layer which are made in contact by interconnection in a method of manufacturing a contact structure between two conductive layers in a semiconductor device and to effectively prevent diffusion of impurities between the first and second conductive layers in a heat treatment process.

Still another object of the present invention is to effectively prevent a thick oxide film from being formed on the surface of a first conductive layer by oxygen supplied from the outside air in a case where a second conductive layer is formed using a conventional CVD apparatus in a method of manufacturing a contact structure between two conductive layers in a semiconductor device.

A further object of the present invention is to effectively prevent growth of an oxide film on a boundary surface between a first conductive layer and a second conductive layer which are made in contact with each other by interconnection in a semiconductor device having a contact structure between two conductive layers and a method of manufacturing the same.

According to an aspect of the present invention, a semiconductor device includes a first conductive layer, a second conductive layer electrically in contact with the first conductive layer, and a nitrided oxide film interposed between the first conductive layer and the second conductive layer and having a thickness sufficient for a tunnel current to flow between the first conductive layer and the second conductive layer.

In operation, since the nitrided oxide film having a thickness sufficient for a tunnel current to flow is interposed between the first conductive layer and the second conductive layer, formation of a thick oxide film between the first conductive layer and the second conductive layer is effectively prevented. In addition, the nitrided oxide film effectively prevents impurities in the first conductive layer and impurities in the second conductive layer from being diffused to each other.

According to another aspect of the present invention, a semiconductor device includes a first conductive layer, an insulating layer formed on the first conductive layer and having an opening formed to expose the contact part of the first conductive layer, a second conductive layer formed on the insulating layer to at least fill the opening, and a thin film interposed between the first conductive layer and the second conductive layer in the opening and formed of material having a thickness sufficient to prevent impurities from flowing between the first conductive layer and the second conductive layer as well as to establish ohmic contact between the first conductive layer and the second conductive layer.

In operation, the second conductive layer is formed to fill the opening in the insulating layer formed on the first conductive layer, and the thin film, which is formed of material having a thickness sufficient to prevent impurities from flowing between the first conductive layer and the second conductive layer as well as to establish ohmic contact between the first conductive layer and the second conductive layer, is interposed between the first conductive layer and the second conductive layer in the opening so that impurities in the first conductive layer and impurities in the second conductive layer are effectively prevented from being diffused to each other.

A method of manufacturing a semiconductor device according to still another aspect of the present invention is a method of manufacturing a semiconductor device including a first conductive layer and a second conductive layer in contact with each other, which includes the steps of forming a natural oxide film on a first conductive layer, carrying out predetermined processing on the natural oxide film to form a processed oxide film having a thickness sufficient to prevent impurities from flowing between the first conductive layer and the second conductive layer as well as to establish ohmic contact between the first conductive layer and the second conductive layer, and forming the first conductive layer and the second conductive layer in contact with each other through the processed oxide film.

In operation, the natural oxide film is formed on the first conductive layer, the natural oxide film is processed to form a processed oxide film having a thickness sufficient to prevent impurities from flowing between the first conductive layer and the second conductive layer as well as to establish ohmic contact between the first conductive layer and the second conductive layer, and the first conductive layer and the second conductive layer in contact with each other through the processed oxide film are formed, so that impurities are effectively prevented from being diffused between the first conductive layer and the second conductive layer even in a case where heat treatment is carried out in a later process. In addition, if a nitrided oxide film is used as the processed oxide film, growth of an oxide film between the first conductive layer and the second conductive layer is effectively prevented even in a case where heat treatment is carried out in an atmosphere of oxygen in a later process.

According to a further aspect of the present invention, a semiconductor device includes a first conductive layer, a second conductive layer which is in contact with the first conductive layer, and a layer including nitrogen atoms formed in a contact part between the first conductive layer and the second conductive layer.

In operation, since the layer including nitrogen atoms is formed in the contact part between the first conductive layer and the second conductive layer, oxidation caused by oxygen caught therein from the outside air is effectively prevented even in a case where a polycrystalline silicon film is formed on the layer including nitrogen atoms by a conventional CVD apparatus.

According to a still further aspect of the present invention, a method of manufacturing a semiconductor device is a method of manufacturing a semiconductor device having a structure in which a first conductive layer and a second conductive layer are in contact with each other, which includes the step of forming a natural oxide film on a first conductive layer, the step of nitriding the natural oxide film to form a nitrided oxide film, the step of removing the nitrided oxide film, and the step of forming a second conductive layer.

In operation, since the natural oxide film formed on the first conductive layer is nitrided to form the nitrided oxide film, and the second conductive layer is formed after removing the nitrided oxide film, a layer including nitrogen is interposed in a contact part between the first conductive layer and the second conductive layer, and oxidation on the interface between the first conductive layer and the second conductive layer in a later process is suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The preferred embodiments of the present invention are described in the following with reference to the drawings.

Figure 1:
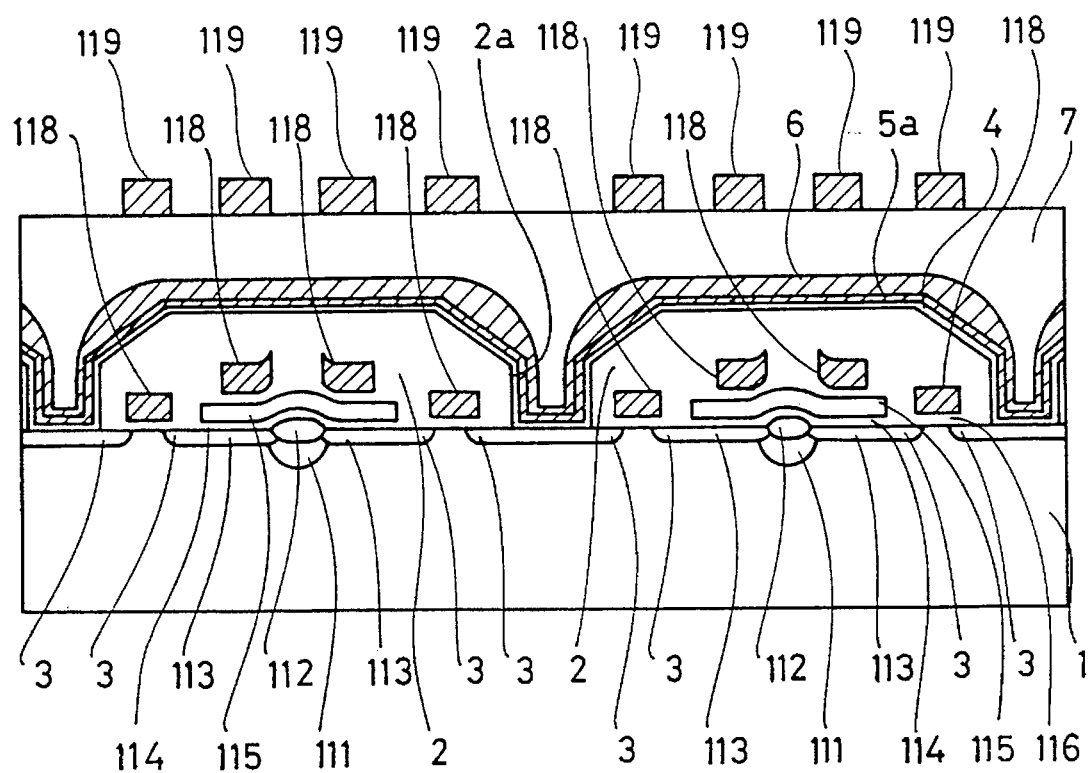
FIG. 1 is a sectional structure view for describing a contact structure for interconnection in a DRAM of the present invention.

First, referring to FIG. 1, a DRAM according to an embodiment of the present invention includes a silicon substrate 1, thick isolating oxide film 112 formed on silicon substrate 1, spaced a predetermined distance apart from each other, n-type impurity diffused regions 3 formed on silicon substrate 1 between thick isolating oxide films 112 to form source/drain regions of MOS transistors, n-type impurity diffused regions 113 formed adjacent to thick isolating oxide films 112, p-type impurity diffused regions 111 formed beneath isolating oxide films 112, cell plates 115 formed on n-type impurity diffused regions 113 through capacitor gate insulating films 114, gate electrodes 118 each formed on silicon substrate 1 between adjacent two n-type impurity diffused regions 3 through gate oxide film 116, an insulating oxide film 2 formed to cover the whole surface and having a contact hole 2a on one of n-type impurity diffused region 3 included in a MOS transistor, a nitrided oxide film 4 formed to cover insulating oxide film 2 and n-type impurity diffused region 3 in contact hole 2a, a polycrystalline silicon film 5a formed on nitrided oxide film 4 to be electrically in contact with n-type impurity diffused region 3 in contact hole 2a and to extend onto insulating oxide film 2, a refractory metal silicide film 6 formed on polycrystalline silicon film 5a, an interlayer insulating film 7 formed to cover the whole surface, and aluminum interconnection layers 119 formed on interlayer insulating film 7, spaced a predetermined distance apart from each other.

Next, referring to FIG. 2, details of a bit line contact part will be described. Polycrystalline silicon film 5a is doped with impurities, and interlayer insulating film 7 is formed of a PSG film or the like.

The composition of nitrided oxide film 4 is represented by the following chemical formula.

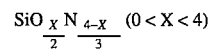

$$SiO_{\frac{X}{2}} N_{\frac{4-X}{3}} \quad (0 < X < 4)$$

In addition, the nitrided oxide film has a thickness of at most 20Å.

As described above, according to this embodiment, a nitrided oxide film 4 having excellent resistance to oxidation is interposed between n-type impurity diffused region 3 and polycrystalline silicon film 5a doped with impurities. Accordingly, it is also possible to effectively prevent oxidation from being caused by oxygen in the outside air which is caught therein in a case where polycrystalline silicon film 5 is formed on nitrided oxide film 4 using a conventional CVD apparatus. In addition, it is possible to effectively prevent a thick oxide film from being formed between n-type impurity diffused region 3 and polycrystalline silicon film 5a by high heat treatment in a oxygen atmosphere on the occasion of formation of interlayer insulating film 7. As a result, it is possible to obtain satisfactory ohmic contact between n-type impurity diffused region 3 and polycrystalline silicon film 5a. Specifically, satisfactory ohmic contact between n-type impurity diffused region 3 and polycrystalline silicon film 5a is achieved by tunnel current flowing in nitrided oxide film 4. In addition, nitrided oxide film 4 effectively prevents impurities in polycrystalline silicon film 5a from being diffused into n-type impurity region 3 because of a heat treatment process on the occasion of formation of interlayer insulating film 7.

Figure 3:
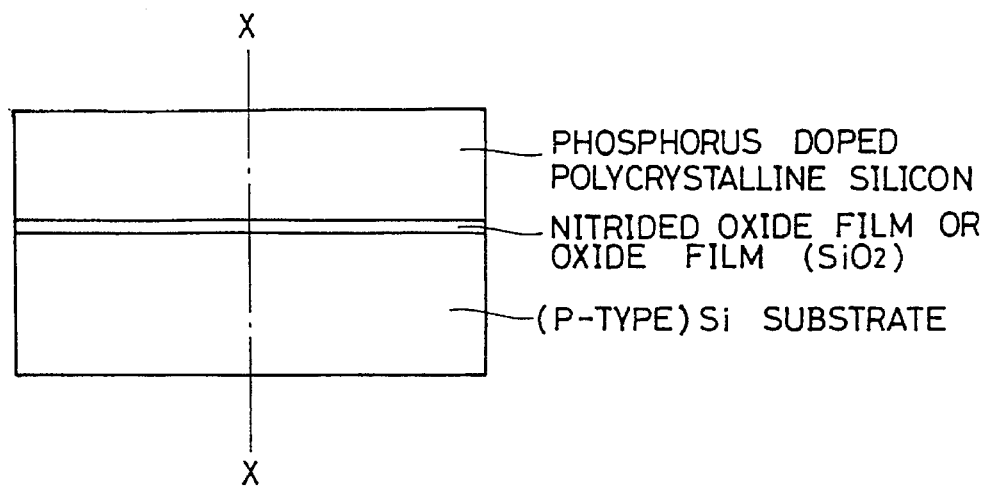
FIG. 3 is a sectional view for describing an impurity profile of the contact structure for interconnection illustrated in FIG. 2.
Figure 4:
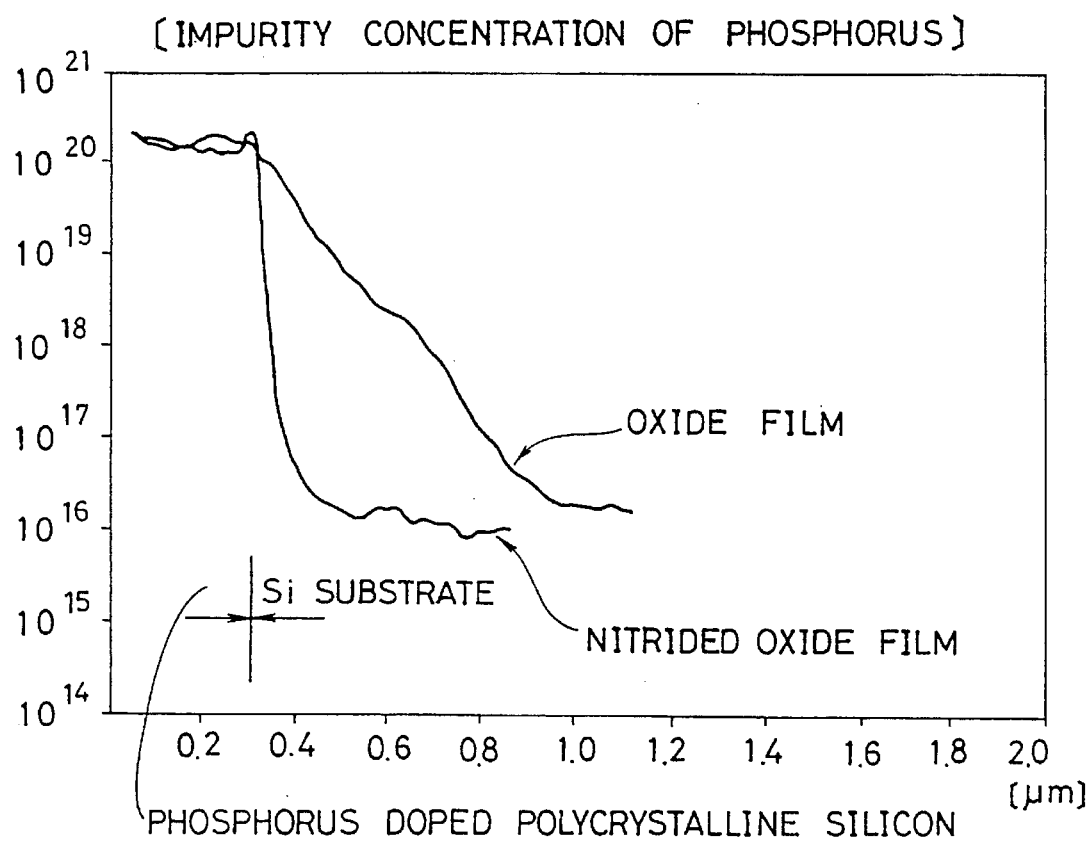
FIG. 4 is a graph illustrating an impurity profile taken along line X—X in FIG. 3.

Referring to FIG. 3, the structure includes an upper layer of phosphorus doped polycrystalline silicon (polycrystalline silicon doped with phosphorus), a lower layer of P-type Si substrate, and a middle layer of a nitrided oxide film or an oxide film ($SiO_2$). Heat treatment is carried out at a temperature of 900° C. for 10 minutes, and then the impurity profile is measured. Referring to FIG. 4, it is seen that in a case where the middle layer is a nitrided oxide film, the impurity concentration is suddenly lowered on the interface between the phosphorus doped silicon and the Si substrate. This means that it is possible to effectively prevent phosphorus in the phosphorus doped polysilicon from diffused into the Si substrate by using the nitrided oxide film. On the other hand, it is seen that in a case where the middle layer is a silicon oxide film, the impurity concentration is gently lowered as a function of depth into the Si substrate. This means that it is not possible to effectively prevent phosphorus in the phosphorus doped polycrystalline silicon from being diffused into the Si substrate by using the silicon oxide film.

As described above, it is also possible to effectively prevent phosphorus in the phosphorus doped polycrystalline silicon from being diffused even if heat treatment is carried out in the subsequent process by making the nitrided oxide film interposed between the Si substrate and the phosphorus doped polycrystalline silicon.

Referring to FIG. 2 and FIGS. 5 to 9, a manufacturing process of a contact structure for interconnection according to this embodiment will be described.

Figure 5:
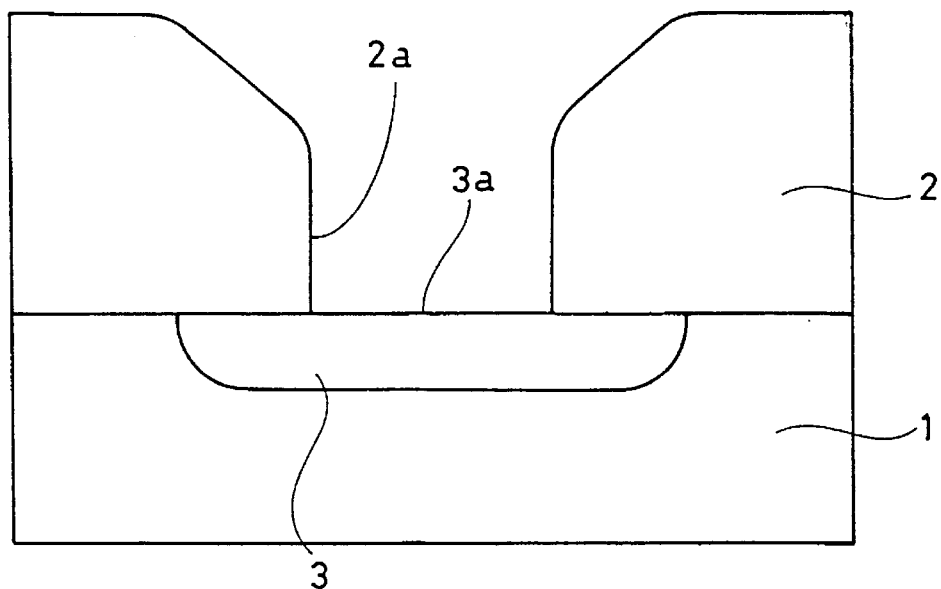
FIG. 5 is a sectional view for describing a first step of a manufacturing process of the contact structure for interconnection illustrated in FIG. 2.
Figure 6:
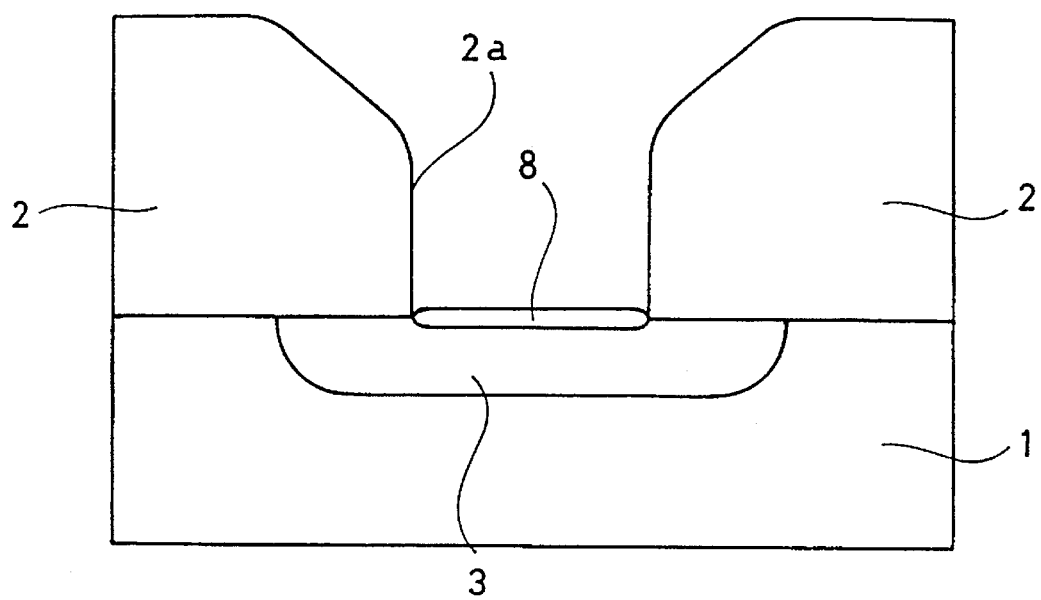
FIG. 6 is a sectional view for describing a second step of the manufacturing process of the contact structure for interconnection illustrated in FIG. 2.

First, as illustrated in FIG. 5, an n-type impurity diffused region 3 is formed in a predetermined region on a main surface of a silicon substrate 1. An insulating oxide film 2 is formed on the whole surface of silicon substrate 1. A contact hole 2a is formed in a region in insulating oxide film 2 on a surface part 3a in n-type impurity diffused region 3. As illustrated in FIG. 6, a natural oxide film 8 is formed on surface part 3a exposed by formation of contact hole 2a. Natural oxide film 8 is formed to have a thickness of approximately 10Å under the condition of a normal temperature and a normal pressure.

Figure 7:
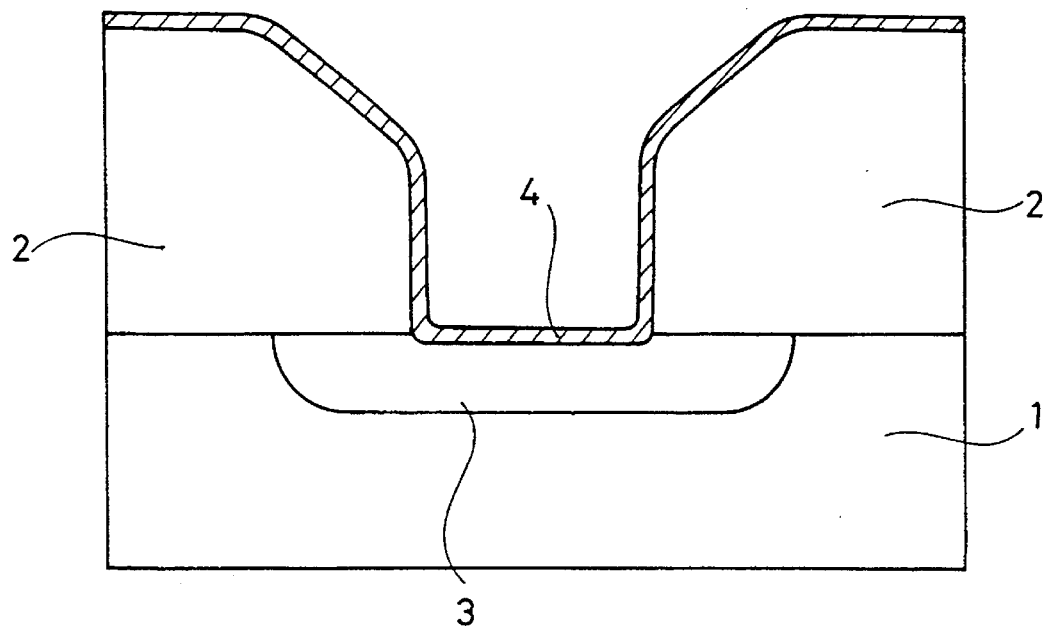
FIG. 7 is a sectional view for describing a third step of the manufacturing process of the contact structure for interconnection illustrated in FIG. 2.

Next, as illustrated in FIG. 7, natural oxide film 8 (See FIG. 6) is thermally nitrided at high speed to form a nitrided oxide film 4.

Figure 9:
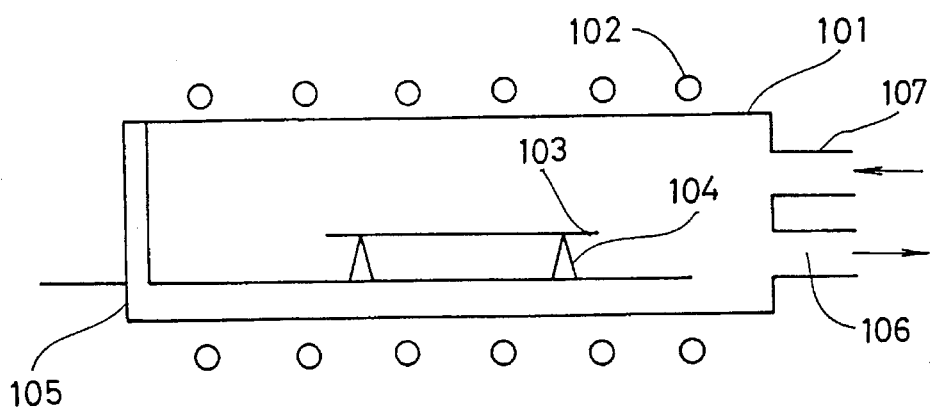
FIG. 9 is a typical view illustrating a lamp annealing apparatus for forming a nitrided oxide film.

Now, referring to FIG. 9, a lamp annealing apparatus for forming nitrided oxide film 4 will be described. A lamp annealing apparatus includes a reaction tube 101, halogen lamps 102 arranged in the periphery of reaction tube 101 for heating the reaction tube, susceptors 104 arranged in reaction tube 101 for setting a wafer 103, a sealing lid 105 for sealing the reaction tube, a pressure reducing exhaust port 106 for reducing the pressure in reaction tube 101, and a reaction gas port 107 for introducing reaction gas into reaction tube 101. In operation, wafer 103 is arranged on susceptors 104. Then, reaction tube 101 is sealed with sealing lid 105. The pressure in reaction tube 101 is reduced by pressure reducing exhaust port 106. Reaction gas is introduced from reaction gas port 107 to make the reaction gas flow in reaction tube 101. Wafer 103 is heated by halogen lamps 102 with the reaction gas flowing in reaction tube 101. This causes the surface of wafer 103 and the reaction gas to react. At this time, the reaction gas is ammonia gas ($NH_3$), the reaction temperature is at least 700° C., and the reaction time is approximately 30 seconds.

A method in which a natural oxide film is nitrided by carrying out heat treatment in an ammonia ($NH_3$) atmosphere before forming a polycrystalline silicon film by a CVD process may be applied as a method of manufacturing a nitrided oxide film in addition to the method using a lamp annealing apparatus as described above.

Figure 8:
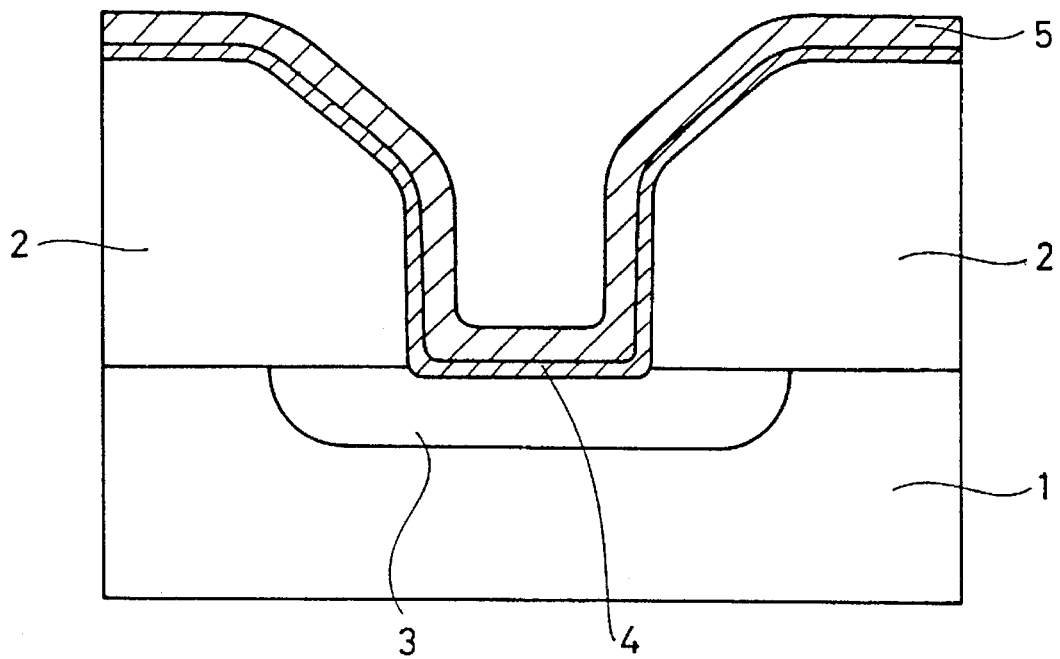
FIG. 8 is a sectional view for describing a fourth step of the manufacturing process of the contact structure for interconnection illustrated in FIG. 2.

Then, as illustrated in FIG. 8, a polycrystalline silicon film 5 is formed on nitrided oxide film 4 by a CVD process.

Figure 28:
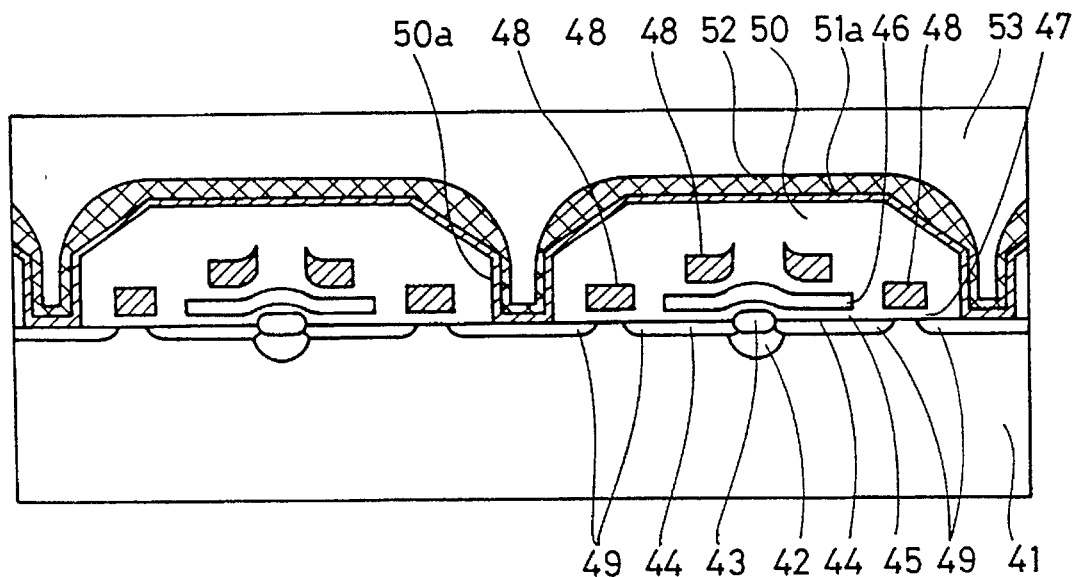
FIG. 28 is a sectional view for describing a fifth step of the manufacturing process of the conventional DRAM illustrated in FIG. 23.
Figure 29:
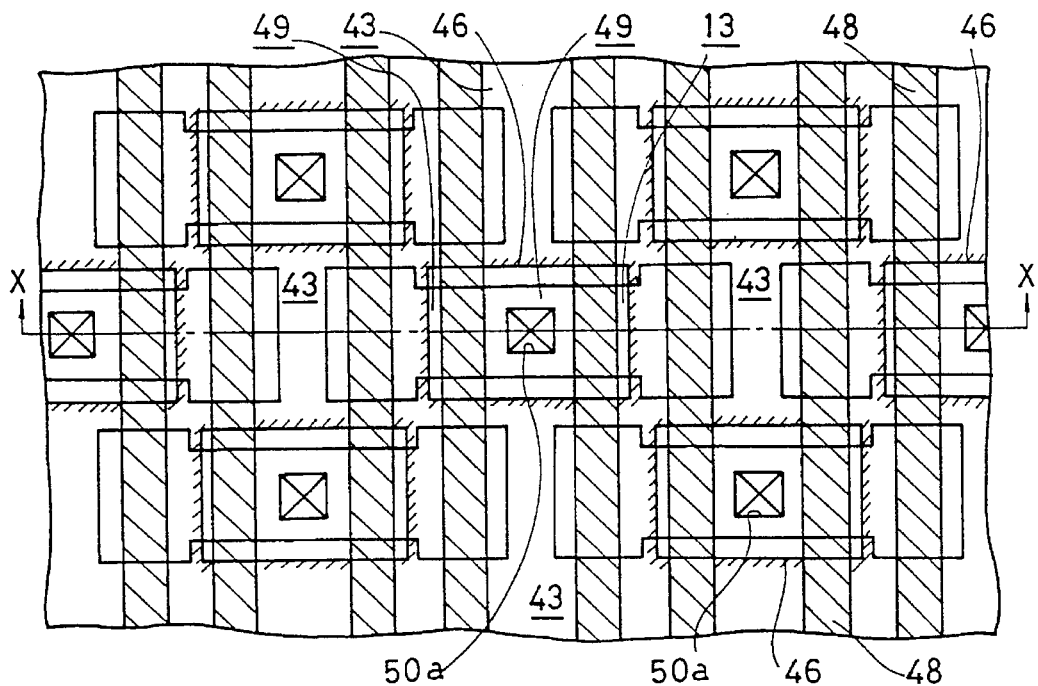
FIG. 29 is a plan view of the DRAM in the second step of the manufacturing process illustrated in FIG. 25.
Figure 30:
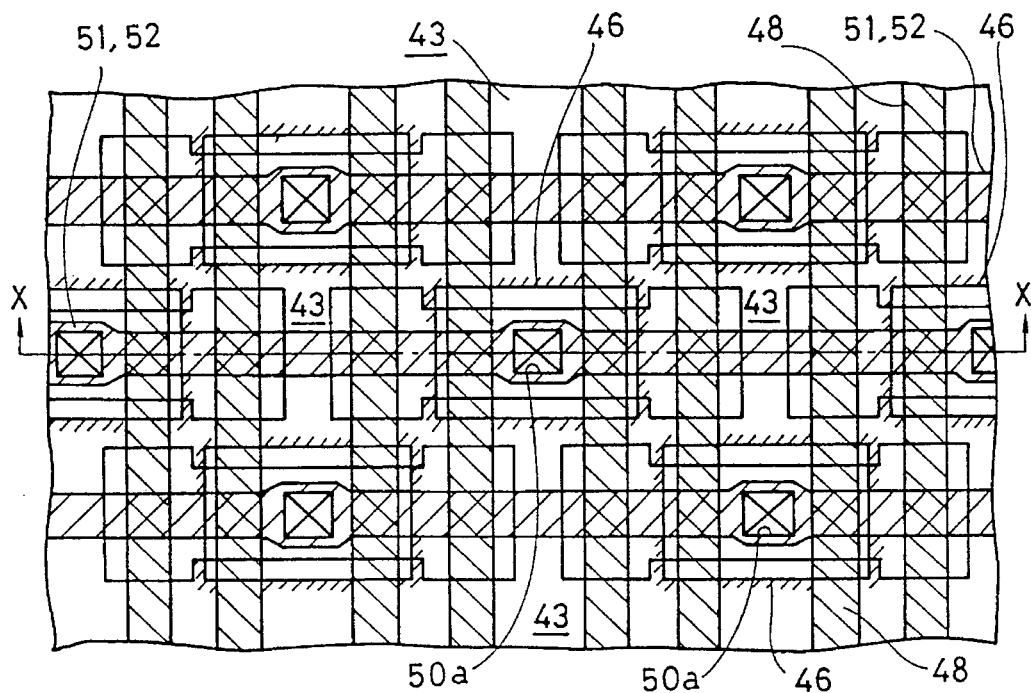
FIG. 30 is a plan view of the DRAM in the fifth step of the manufacturing process illustrated in FIG. 28.
Figure 31:
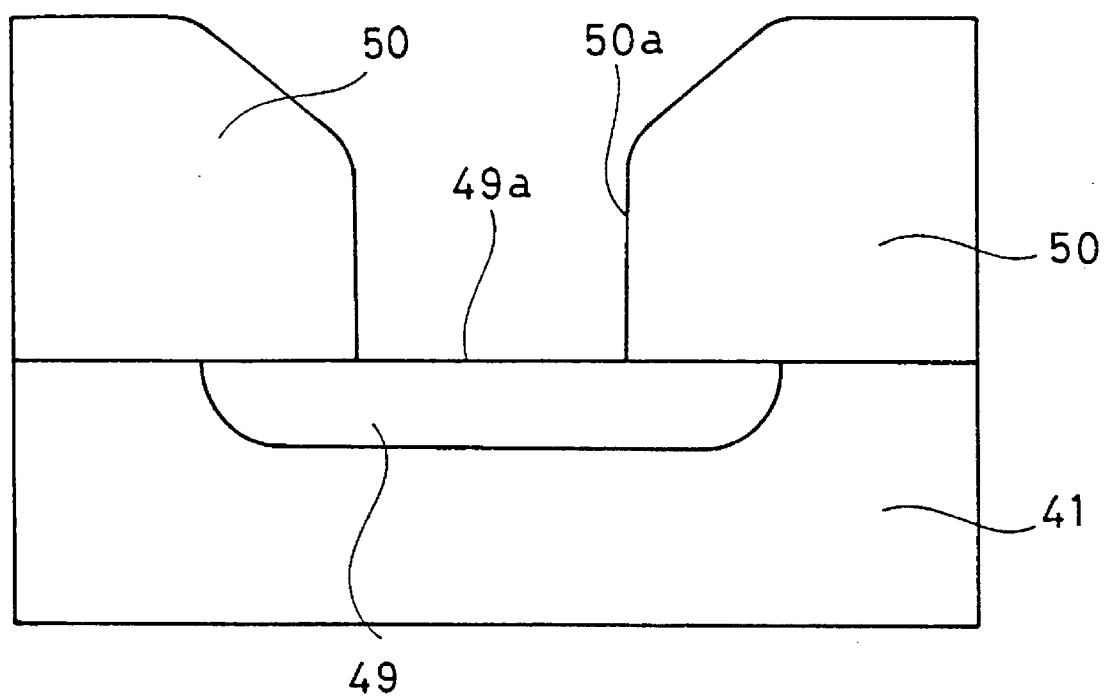
FIG. 31 is a sectional structure view for describing a first step of the formation process of the polycrystalline silicon film illustrated in FIG. 26.
Figure 32:
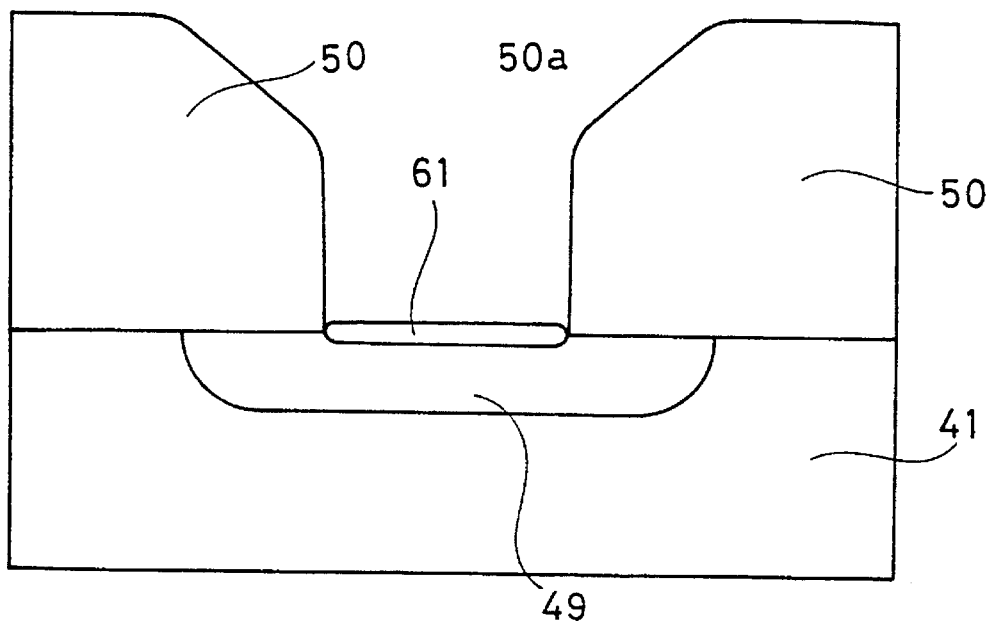
FIG. 32 is a sectional structure view for describing a second step of the formation process of the polycrystalline silicon film illustrated in FIG. 26.
Figure 33:
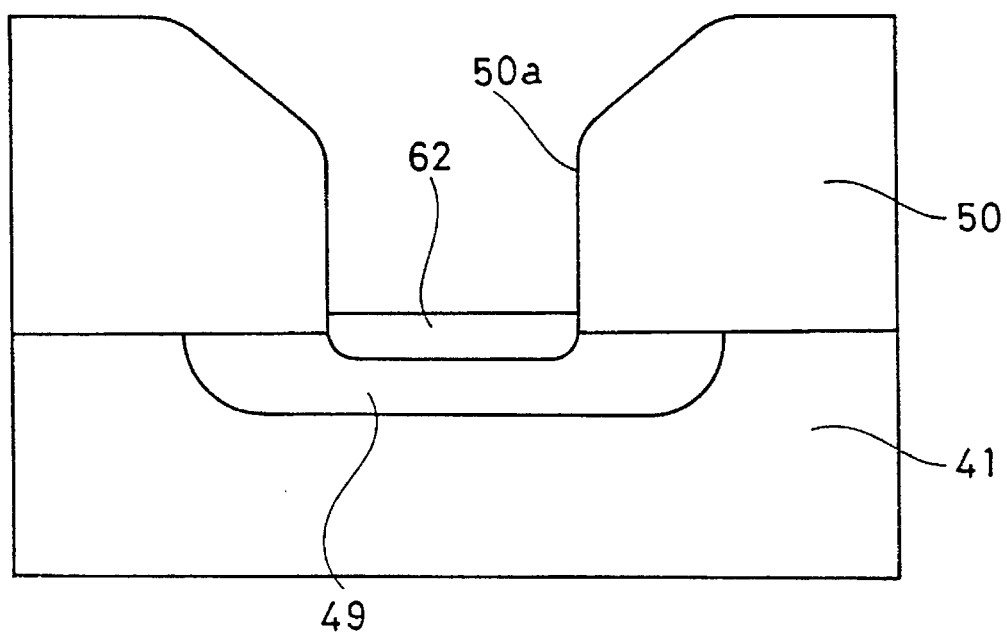
FIG. 33 is a sectional structure view for describing a third step of the formation process of the polycrystalline silicon film illustrated in FIG. 26.
Figure 34:
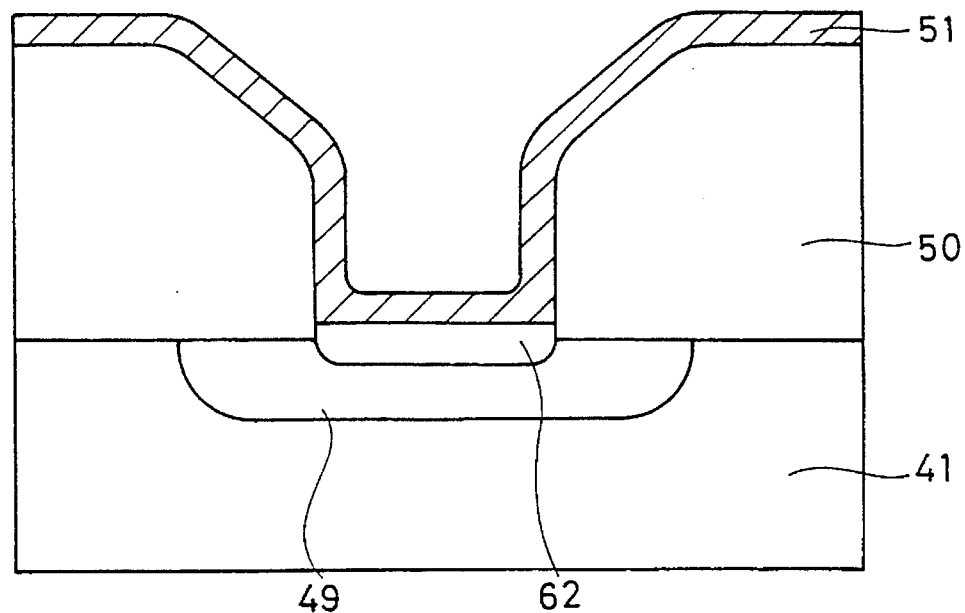
FIG. 34 is a sectional structure view for describing a fourth step of the formation process of the polycrystalline silicon film illustrated in FIG. 26.
Figure 35:
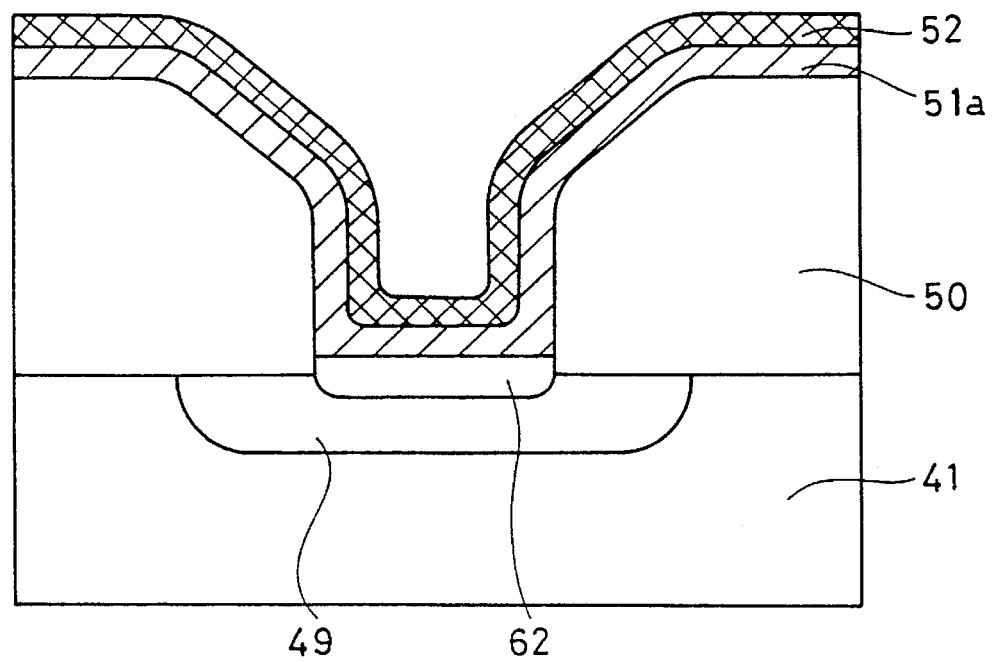
FIG. 35 is a sectional structure view for describing a fifth step of the formation process of the polycrystalline silicon film illustrated in FIG. 26.
Figure 36:
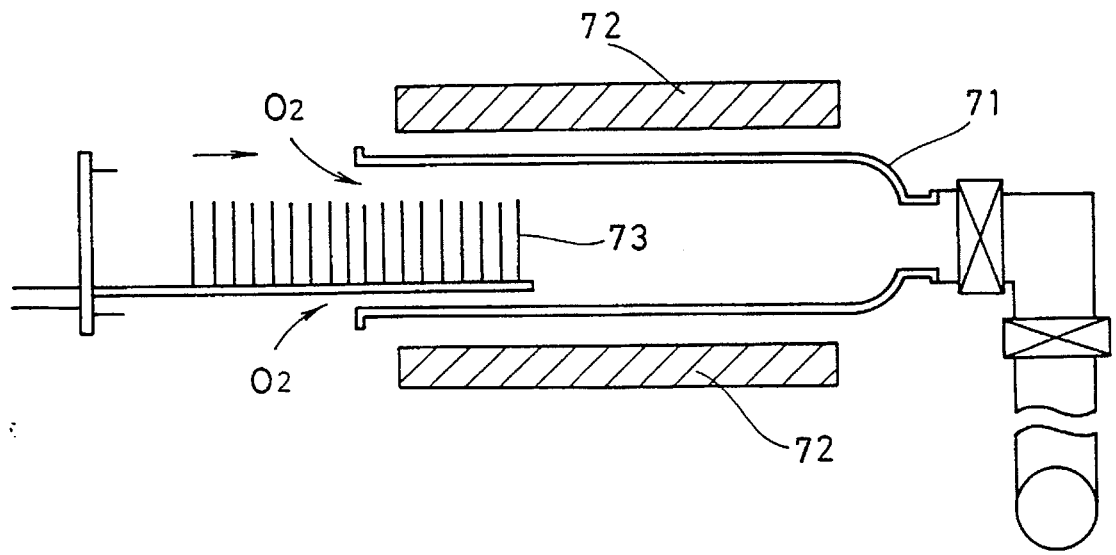
FIG. 36 is a typical view illustrating a sectional structure of a CVD apparatus for forming the polycrystalline silicon film illustrated in FIG. 34.
Figure 37:
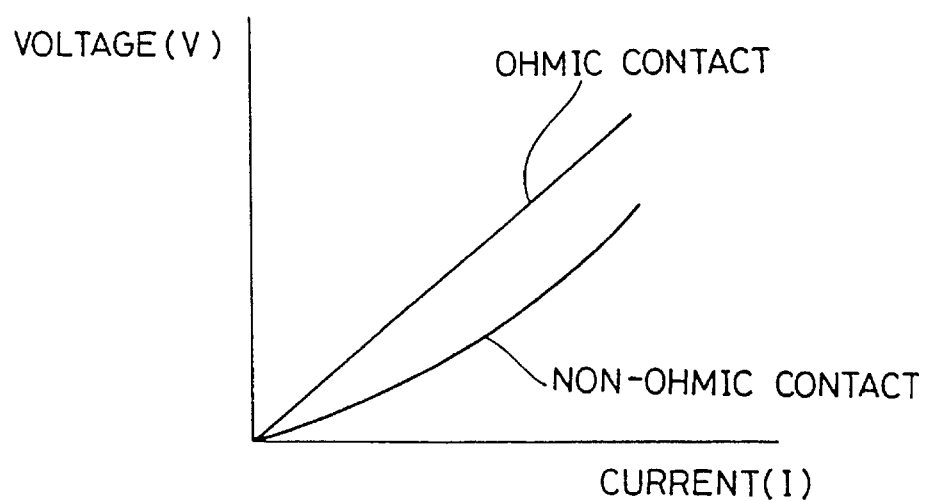
FIG. 37 is a graph of current/voltage characteristics for describing ohmic contact.
Figure 38:
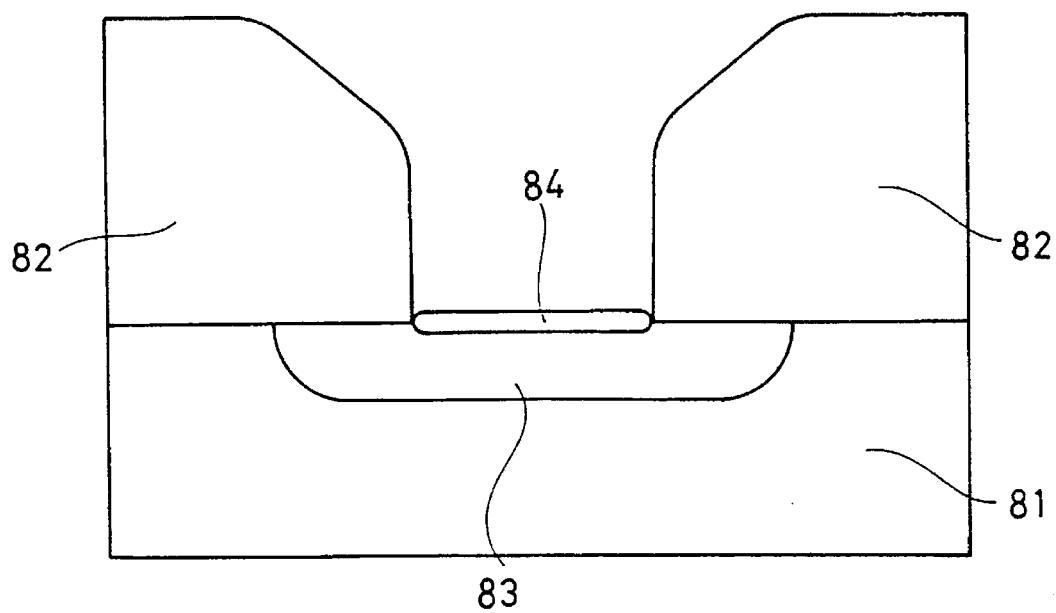
FIG. 38 is a sectional structure view for describing a first step of the conventionally proposed formation process of a polycrystalline silicon film using a CVD process.
Figure 39:
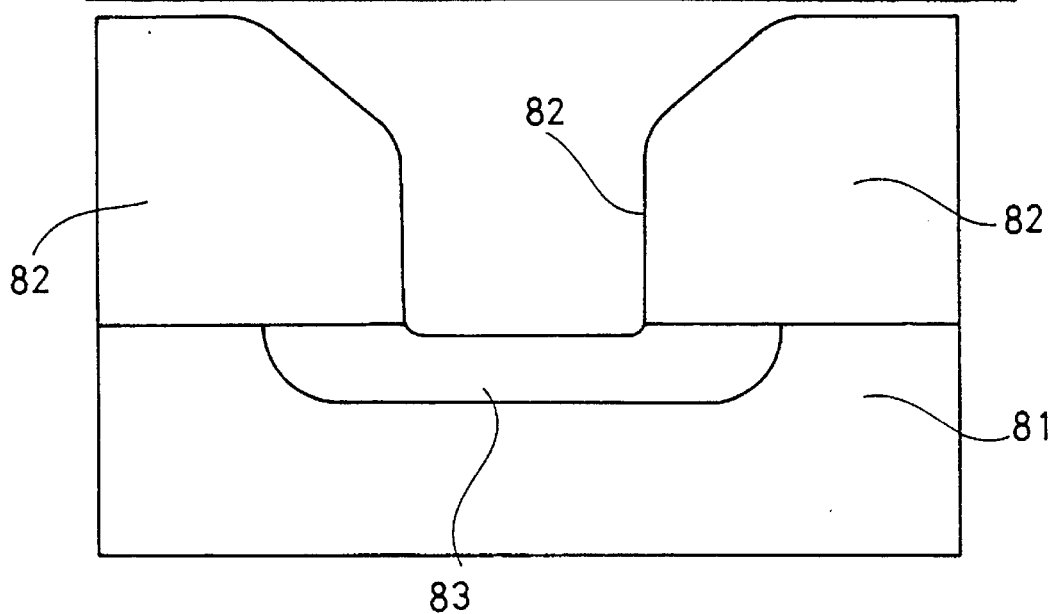
FIG. 39 is a sectional structure view for describing a second step of the conventionally proposed formation process of a polycrystalline silicon film using a CVD process.
Figure 40:
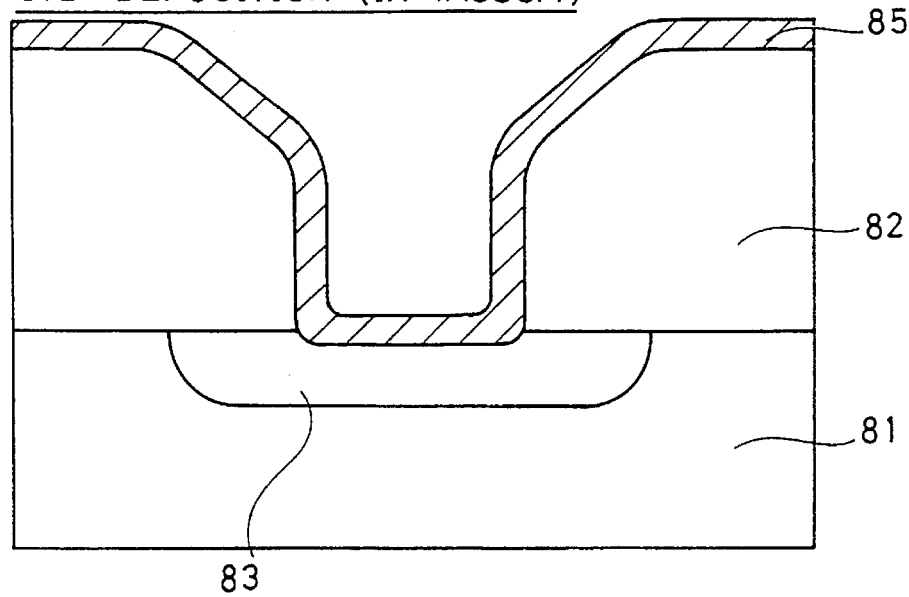
FIG. 40 is a sectional structure view for describing a third step of the conventionally proposed formation process of a polycrystalline silicon film using a CVD process.
Figure 41:
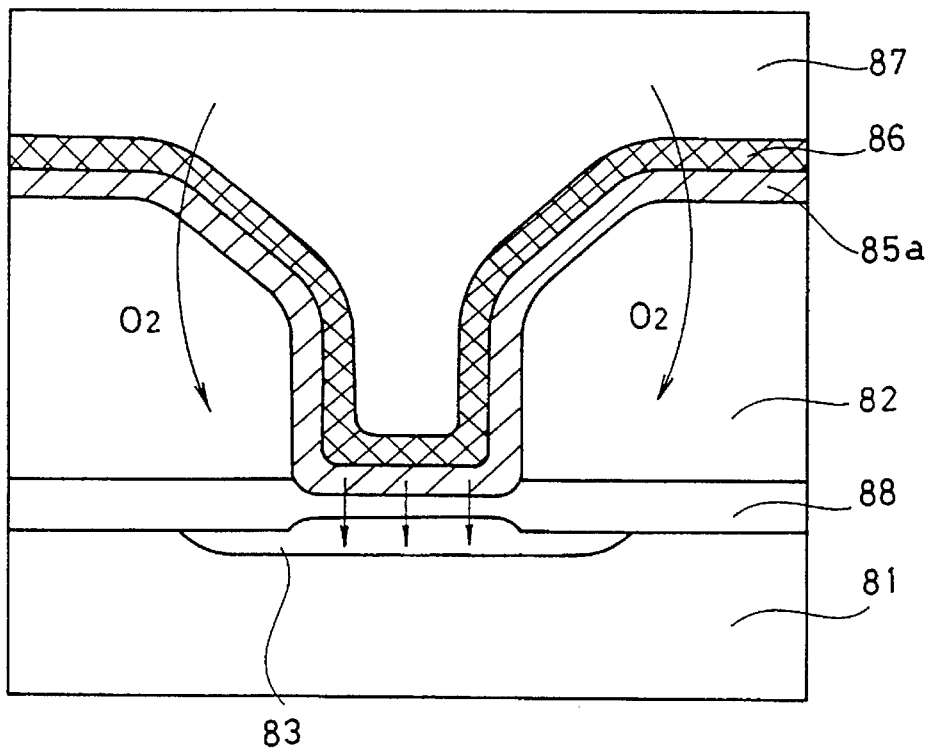
FIG. 41 is a sectional structure view for describing a fourth step of the conventionally proposed formation process of a polycrystalline silicon film using a CVD process.
Figure 42:
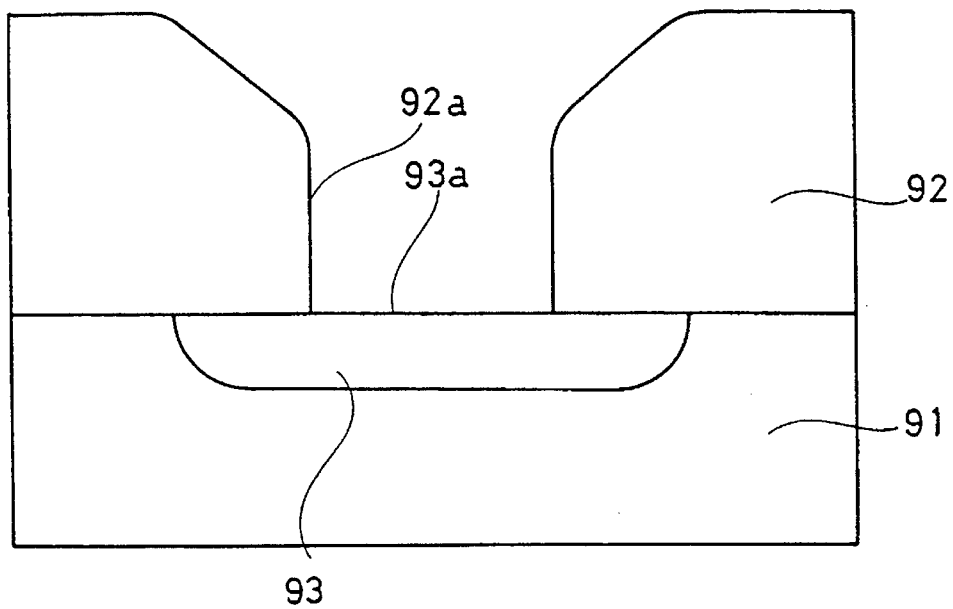
FIG. 42 is a sectional structure view for describing a first step of the conventional formation process of a silicide film using sputtering.
Figure 43:
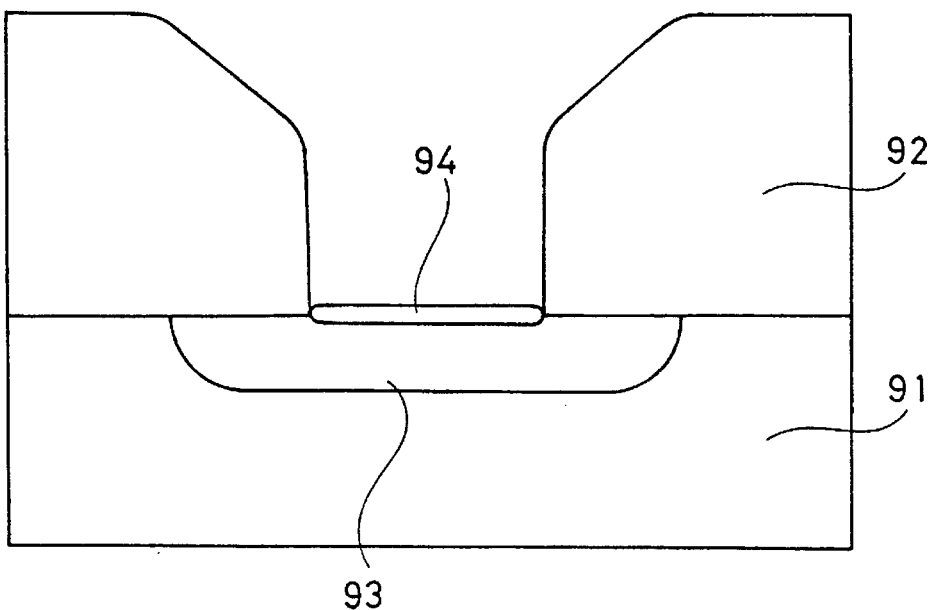
FIG. 43 is a sectional structure view for describing a second step of the conventional formation process of a silicide film using sputtering.
Figure 44:
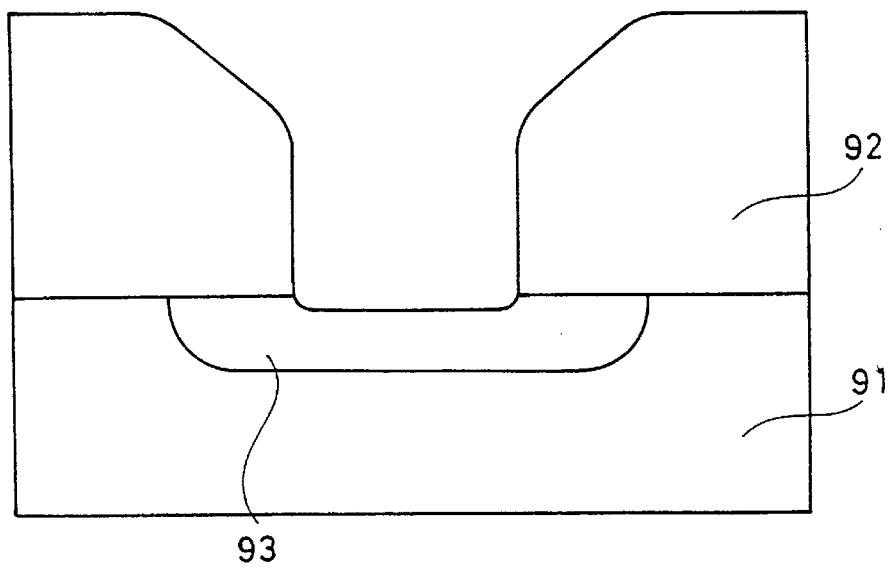
FIG. 44 is a sectional structure view for describing a third step of the conventional formation process of a silicide film using sputtering.
Figure 45:
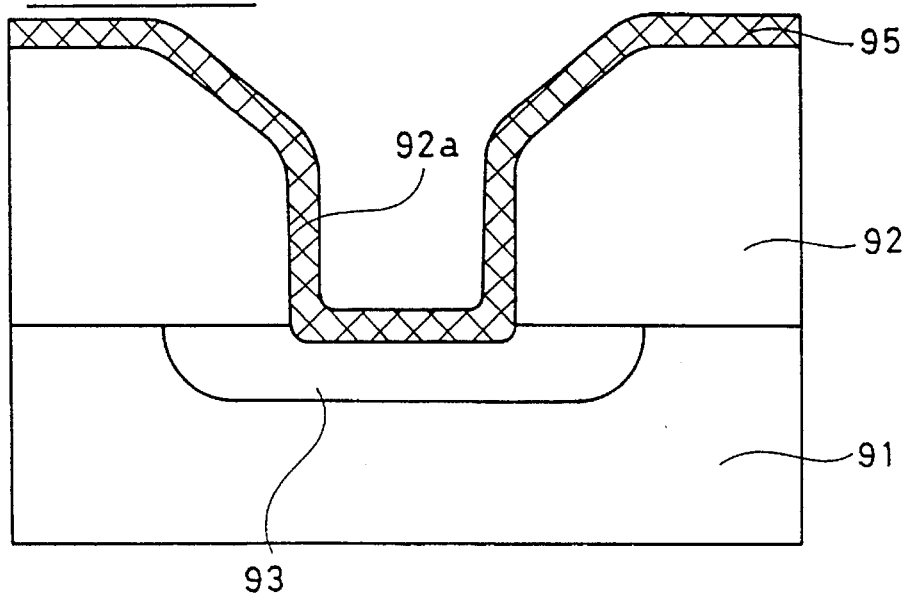
FIG. 45 is a sectional structure view for describing a fourth step of the conventional formation process of a silicide film using sputtering.
Figure 46:
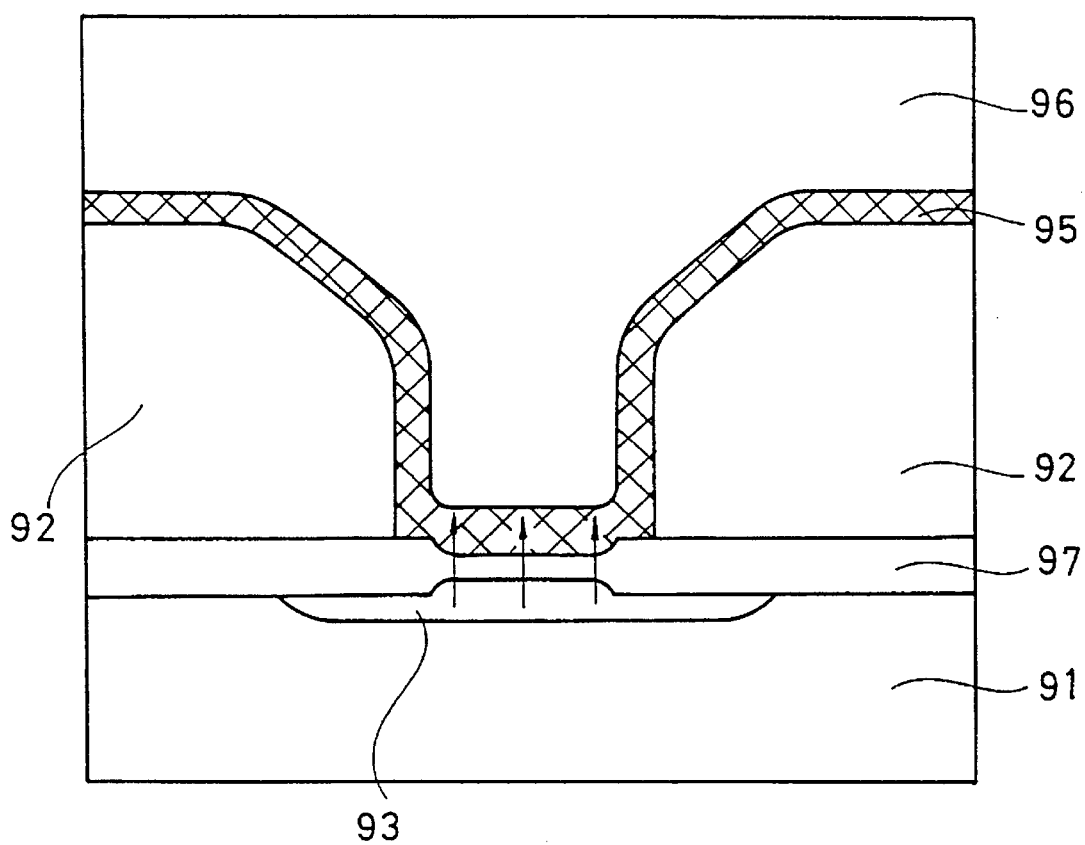
FIG. 46 is a sectional structure view for describing a fifth step of the conventional formation process of a silicide film using sputtering.

Now, consideration will be given to a case where the conventional CVD apparatus illustrated in FIG. 28 is used on the occasion of formation of polycrystalline silicon film 5. Specifically, the wafer in the state illustrated in FIG. 7 is inserted into the CVD apparatus illustrated in FIG. 28. Then, oxygen $O_2$ in the outside air is supplied to the CVD apparatus at the same time that the wafer is carried therein. However, nitrided oxide film 4 illustrated in FIG. 7 has excellent resistance to oxidation, so that oxidation reaction does not proceed even if heat treatment at a high temperature is carried out in an oxygen atmosphere in the CVD apparatus. Specifically, it is also possible to effectively prevent an oxide film from being formed on the surface of nitrided oxide film 4 and on the interface between n-type impurity diffused region 3 and nitrided oxide film 4 in the case where polycrystalline silicon film 5 is formed using a conventional CVD apparatus.

Figure 10:
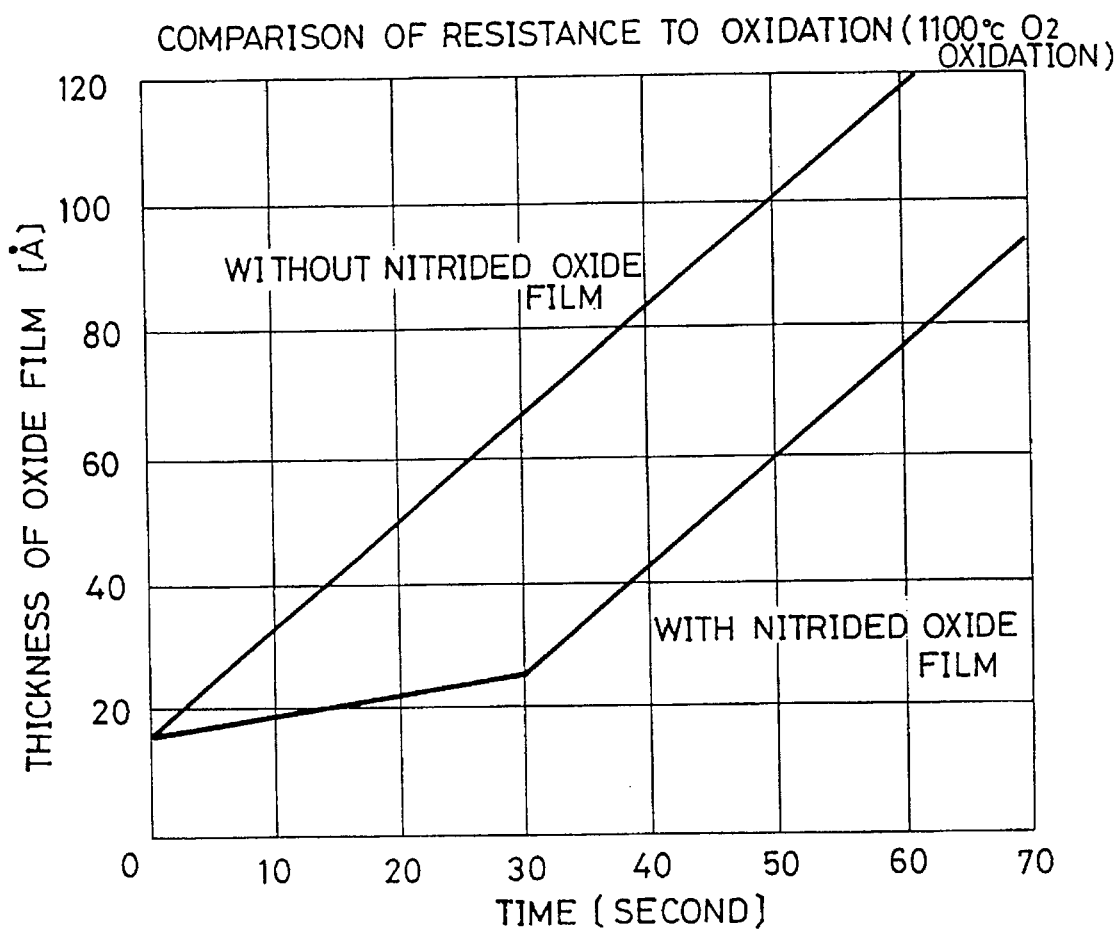
FIG. 10 is a graph for describing resistance to oxidation of a nitrided oxide film.

Now, the resistance to oxidation of nitrided oxide film 4 will be described. Referring to FIG. 10, the oxidation time is indicated on the abscissa, and the thickness of the oxide film is indicated on the ordinate under the condition that the oxidation temperature is 1100° C. It is seen that the resistance to oxidation is remarkably improved in a case where there is a nitrided oxide film in comparison with a case where there is no nitrided oxide film.

Figure 2:
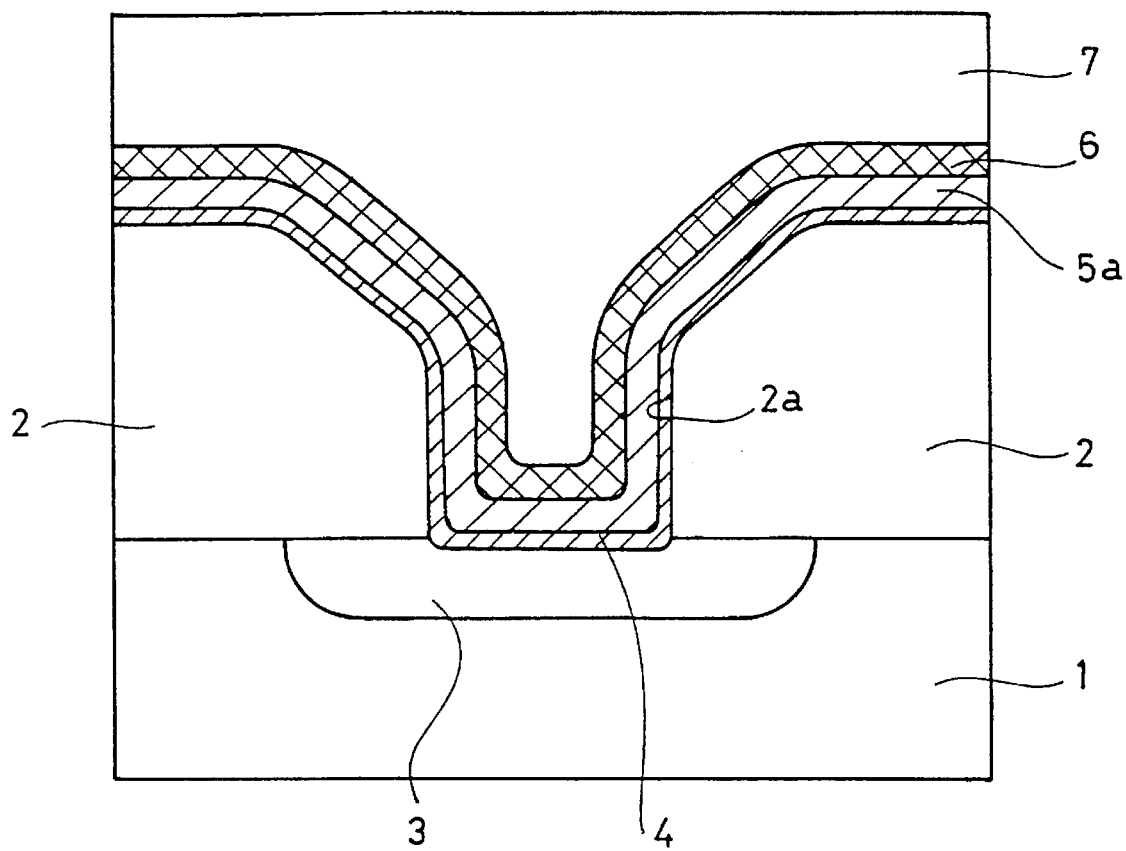
FIG. 2 is a sectional structure view illustrating the contact structure for interconnection illustrated in FIG. 1.

As illustrated in FIG. 8, after polycrystalline silicon film 5 is formed on nitrided oxide film 4, the polycrystalline silicon film is finally doped with impurities (phosphorus) as illustrated in FIG. 2. A refractory metal silicide film 6 is formed on polycrystalline silicon film 5a doped with impurities by a sputtering process. It is considered that $MoSi_2$, $WSi_2$, $TiSi_2$, $TaSi_2$, or the like may be used as a material of refractory metal silicide film 6. After refractory metal silicide film 6 is formed, an interlayer insulating film 7 formed of a PSG film or the like is formed on the whole surface. Heat treatment at a high temperature is also carried out in an oxygen and hydrogen atmosphere on the occasion of formation of interlayer insulating film 7. However, an oxide film is also effectively prevented from growing between polycrystalline silicon film 5a and n-type impurity diffused region 3 because of heat treatment in an oxygen atmosphere on the occasion of formation of interlayer insulating film 7 by the existence of nitrided oxide film 4. In addition, impurities in polycrystalline silicon film 5a are effectively prevented from being diffused into n-type impurity diffused region 3 because of heat treatment at a high temperature on the occasion of formation of interlayer insulating film 7 by nitrided oxide film 4.

Figure 11:
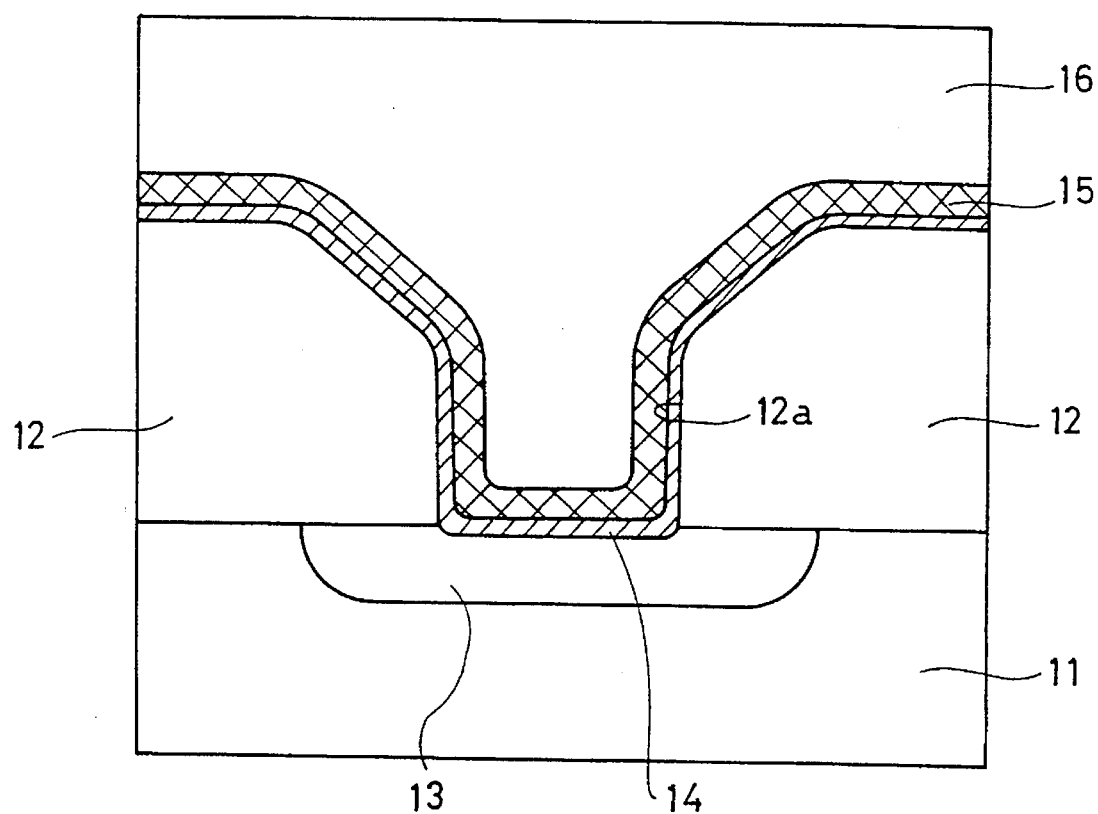
FIG. 11 is a sectional structure view illustrating a contact structure for interconnection according to a second embodiment of the present invention.

Referring to FIG. 11, a case where a bit line in a DRAM is implemented with only a refractory metal silicide film is illustrated in a second embodiment.

Referring to FIG. 11, the contact structure for interconnection according to the second embodiment includes a silicon substrate 11, an n-type impurity diffused region 13 formed in a predetermined region on a main surface of silicon substrate 11, an insulating oxide film 12 formed on the whole surface of silicon substrate 11 and having a contact hole 12a on n-type impurity diffused region 13, a nitrided oxide film 14 formed to be in contact with n-type impurity diffused region 13 in contact hole 12a and to extend onto insulating oxide film 12, a refractory metal silicide film 15 formed on nitrided oxide film 14, and an interlayer insulating film 16 formed on refractory metal silicide film 15.

It is also possible to achieve the same effect as that of the first embodiment by the second embodiment having such a structure. Specifically, it is possible to effectively prevent growth of an oxide film and diffusion of impurities between n-type impurity diffused region 13 and refractory metal silicide film 15 from being caused by a heat treatment process in an oxygen atmosphere on the occasion of formation of interlayer insulating film 16 by nitrided oxide film 14.

Figure 12:
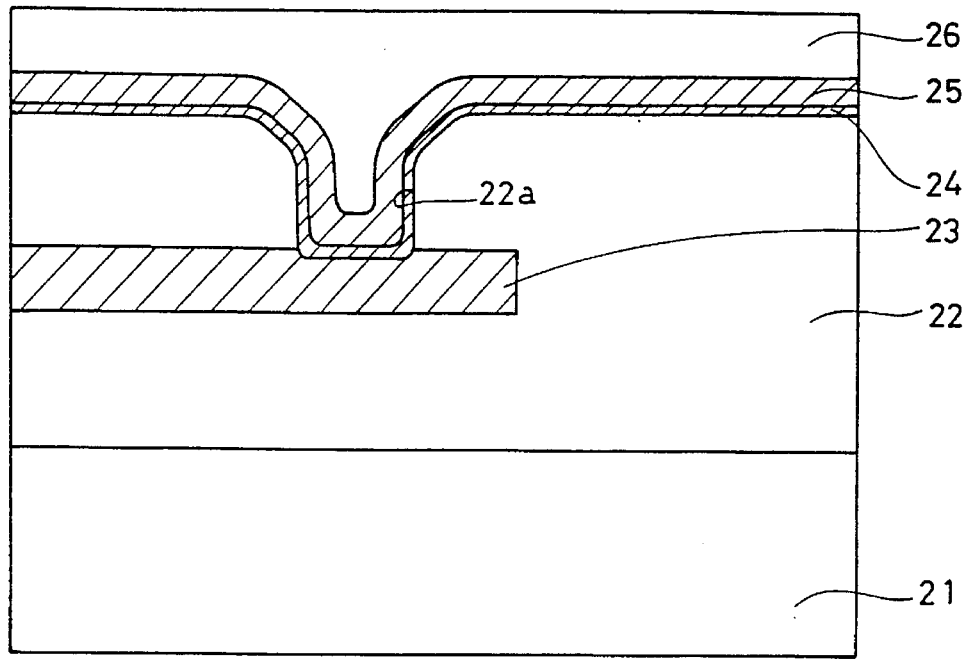
FIG. 12 is a sectional structure view illustrating a contact structure for interconnection according to a third embodiment of the present invention.

Referring to FIG. 12, according to a third embodiment of the present invention, an insulating oxide film 22 is formed on a silicon substrate 21, and a lower interconnecting layer 23 is formed to be surrounded by insulating oxide film 22. A contact hole 22a is formed in a predetermined region in insulating oxide film 22 on lower interconnecting layer 23. A nitrided oxide film 24 is formed to be in contact with the surface of lower interconnecting layer 23 in contact hole 22a and to extend onto insulating oxide film 22. An upper interconnecting layer 25 is formed on nitrided oxide film 24. An interlayer insulating film 26 is formed on upper interconnecting layer 25. Lower interconnecting layer 23 is formed of polycrystalline silicon or the like. Formation of contact hole 22a causes a natural oxide film to be formed on the surface of lower interconnecting layer 23. Nitrided oxide film 24 is formed by thermally nitriding the natural oxide film at high speed by a lamp annealing apparatus. As described above, it is possible to effectively prevent growth of an oxide film and diffusion of impurities from being generated between lower interconnecting layer 23 and upper interconnecting layer 25 by making nitrided oxide film 24 interposed between lower interconnecting layer 23 and upper interconnecting layer 25.

Figure 13:
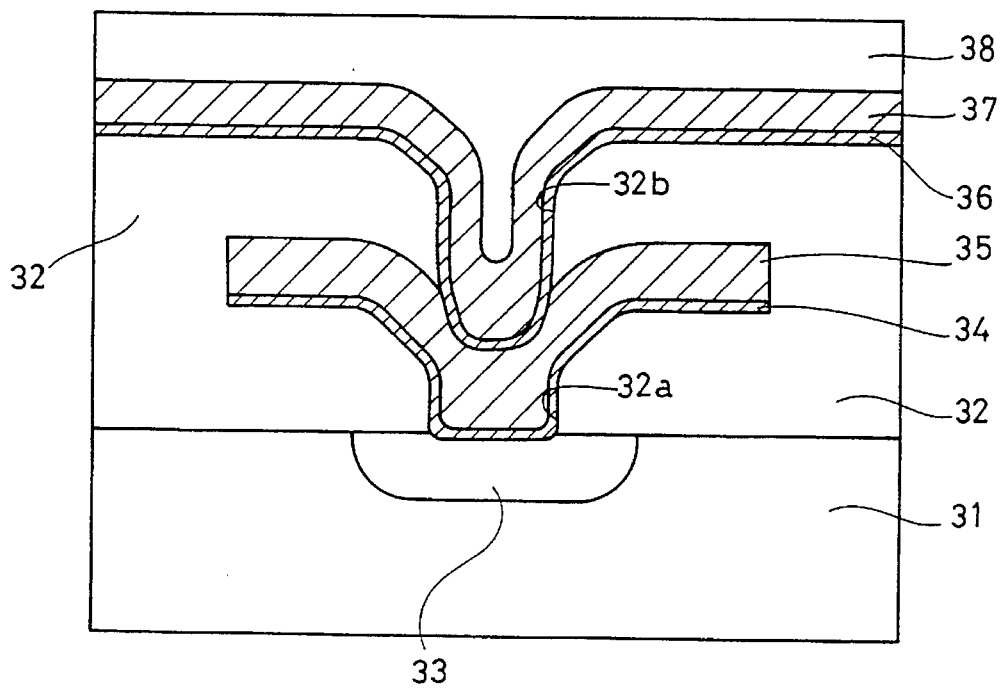
FIG. 13 is a sectional structure view illustrating a contact structure for interconnection according to a fourth embodiment of the present invention.

Referring to FIG. 13, according to a fourth embodiment of the present invention, an n-type impurity diffused region 33 is formed in a predetermined region on a main surface of a silicon substrate 31. An insulating oxide film 32 is formed on silicon substrate 31. Insulating oxide film 32 has a contact hole 32a on n-type impurity diffused region 33. A nitrided oxide film 34 is formed in contact hole 32a to be in contact with n-type impurity diffused region 33. A lower interconnecting layer 35 including a polycrystalline silicon film or the like doped with impurities or the like is formed on nitrided oxide film 34. Insulating oxide film 32 further has a contact hole 32b on lower interconnecting layer 35. A nitrided oxide film 36 is formed in contact hole 32b to be in contact with lower interconnecting layer 35 and to extend onto insulating oxide film 32. An upper interconnecting layer 37 is formed on nitrided oxide film 36. An interlayer insulating film 38 is formed on upper interconnecting layer 37. Such a contact structure for interconnection is used in a case where lower interconnecting layer 35 is used as a pad in a bit line in a DRAM, for example. It is possible to reduce the contact depth of contact hole 32b by using such a structure. This also makes it possible to easily form contact hole 32b in the case of integration.

Figure 14:
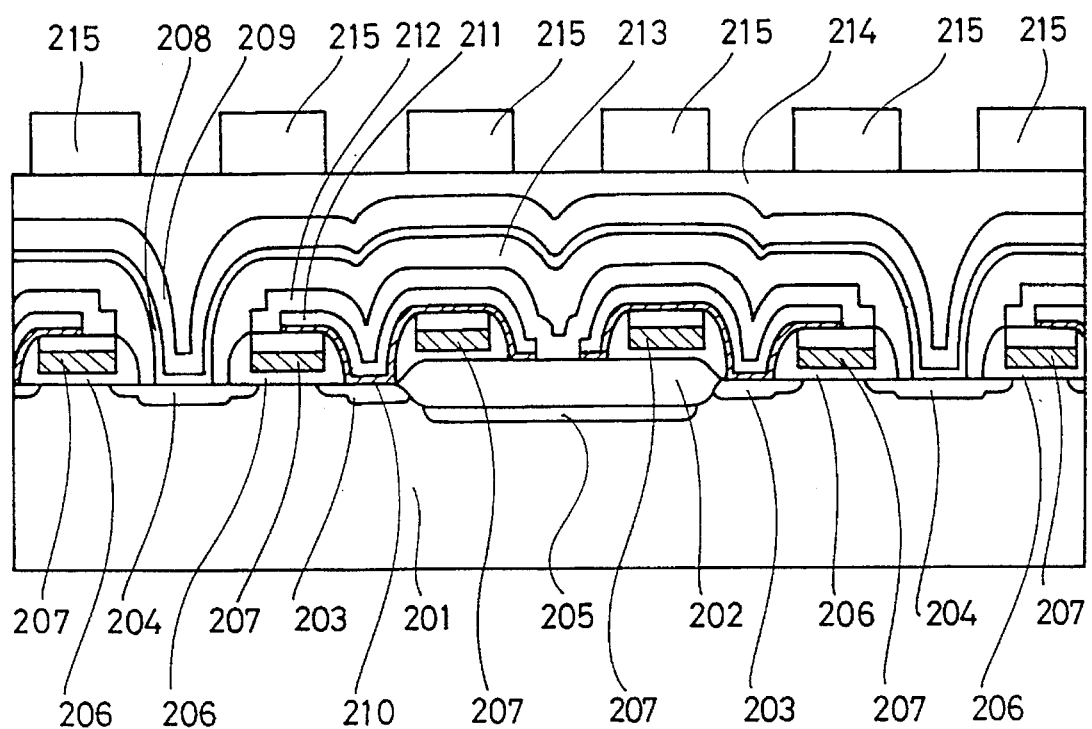
FIG. 14 is a sectional structure view illustrating a contact structure for interconnection in a DRAM according to a fifth embodiment of the present invention.

Next, referring to FIG. 14, a DRAM according to a fifth embodiment of the present invention includes a silicon substrate 201, an isolating oxide film 202 formed in a predetermined region on the surface of silicon substrate 201, a p-type impurity diffused region 205 formed beneath isolating oxide film 202, n-type impurity diffused regions 203 formed adjacent to isolating oxide film 202, n-type impurity diffused regions 204 formed spaced a predetermined distance apart from n-type impurity diffused region 203, gate electrodes 207 each formed on silicon substrate 201 between n-type impurity diffused regions 203 and 204 through a gate oxide film 206, a polycrystalline silicon film 208 electrically connected to n-type impurity diffused regions 204, a refractory metal silicide film 209 formed on polycrystalline silicon film 208, nitrided oxide films 210 each formed to be in contact with n-type impurity diffused region 203 and to extend onto gate electrode 207, a storage node 211 formed on nitrided oxide film 210 and electrically connected to n-type impurity diffused regions 203, a cell plate 212 formed on storage node 211 through a dielectric film (not shown), an interlayer insulating film 213 formed to cover cell plate 212, an interlayer insulating film 214 formed on the whole surface to cover a refractory metal silicide film 209, and aluminum interconnection 215 formed on interlayer insulating film 214, spaced a predetermined distance apart from each other. A MOS transistor is implemented with n-type impurity diffused regions 203 and 204 and gate electrode 207. A bit line is implemented with polycrystalline silicon film 208 and refractory metal silicide film 209. A stacked-type capacitor is implemented with storage node 211, the dielectric film (not shown), and cell plate 212.

As described above, according to this embodiment, nitrided oxide film 210 is interposed between storage node 211 included in a stacked-type capacitor and n-type impurity diffused region 203 electrically connected to storage node 211. Effects as described in the following can be obtained by such a structure.

Specifically, in order to lower the resistance of storage node 211 and to increase efficiency of utilization of storage node 211 as an electrode, polycrystalline silicon doped with impurities (doped polycrystalline silicon) is used as storage node 211. In such a case, the impurity concentration of storage node 211 is normally at the level of $10^{20}$ (cm$^{-3}$), and the impurity concentration of n-type impurity diffused region 203 positioned beneath storage node 211 is in the range of $10^{17}$(cm$^{-3}$) to $10^{18}$(cm$^{-3}$). Conventionally, this difference in concentration causes a disadvantage that impurities in storage node 211 are diffused toward n-type impurity diffused region 203. This causes a problem that an impurity profile of a MOS transistor is varied to degrade characteristics of the MOS transistor. Furthermore, there is also a disadvantage that impurities are diffused from storage node 211 to reach p-type impurity diffused region 205 for isolating elements and vary the impurity profile of p-type impurity diffused region 205. As a result, there is a problem that performance of element isolation is also degraded.

In order to solve the above-described problems, according to the fifth embodiment, nitrided oxide film 210 is interposed between storage node 211 and n-type impurity diffused region 203. Accordingly, it is possible to effectively prevent impurities in storage node 211 from being diffused to n-type impurity diffused region 201 or to p-type impurity diffused region 205. As a result, it is possible to avoid the above-described disadvantages.

As described above, an nitrided oxide film is formed by nitriding a natural oxide film formed on a lower interconnecting layer (a first conductive layer) after a contact hole is opened in each of the above embodiments. This makes it also possible to effectively prevent oxidation from being caused by oxygen in the outside air caught therein in a case where an upper interconnecting layer is formed on the nitrided oxide film using a conventional CVD apparatus. It is also possible to effectively prevent growth of an oxide film and diffusion of impurities between the upper interconnecting layer and the lower interconnecting layer in a case where heat treatment at a high temperature is carried out in the subsequent process.

While a case where an impurity diffused region is n-type and a polycrystalline silicon film is n-type has been described in this embodiment, the present invention is not limited to this, and it is possible that an impurity diffused region is p-type and a polycrystalline silicon film is p-type. The present invention is also applicable to a case where the conductivity types of an impurity diffused region and a polycrystalline silicon film are different. Specifically, it is possible that an impurity diffused region is n-type and a polycrystalline silicon film is p-type, and it is also possible that an impurity diffused region is p-type and a polycrystalline silicon film is n-type. Furthermore, although an example for application using a nitrided oxide film has been described in this embodiment, the present invention is not limited to this, and other materials may be used if they can implement ohmic contact and prevent diffusion of impurities.

Figure 15:
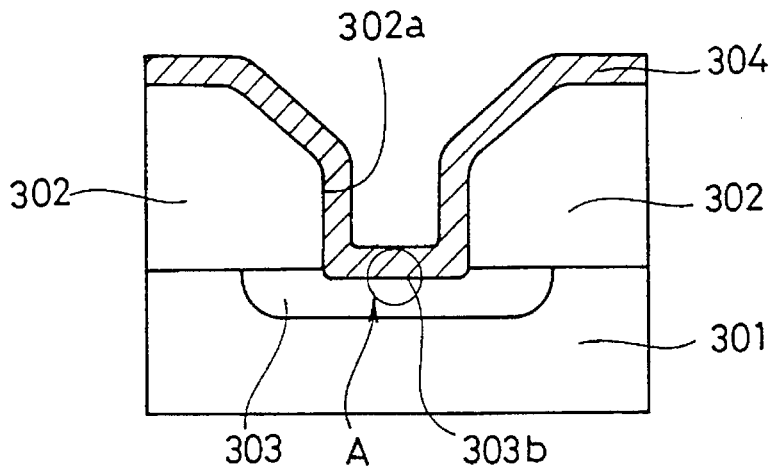
FIG. 15 is a sectional structure view illustrating a contact structure for interconnection according to a sixth embodiment of the present invention.
Figure 16:
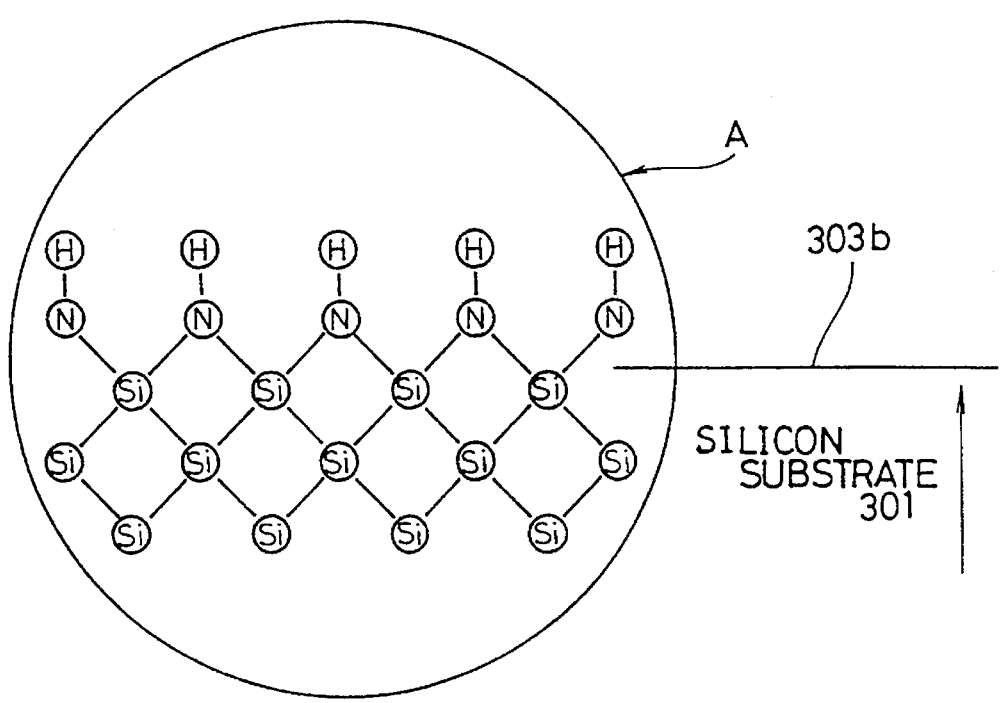
FIG. 16 is a diagram illustrating an atomic arrangement in a part A of the contact structure for interconnection illustrated in FIG. 15.

Referring to FIGS. 15 and 16, a contact structure for interconnection according to a sixth embodiment includes a silicon substrate 301, an n-type impurity diffused region 303 formed in a predetermined region on a main surface of silicon substrate 301, an insulating oxide film 302 formed on the whole surface of silicon substrate 301 and having a contact hole 302a on n-type impurity diffused region 303, and a polycrystalline silicon film 304 formed to be in contact with n-type impurity diffused region 303 in contact hole 302a and to extend onto insulating oxide film 302. Now, in the contact structure for interconnection according to the sixth embodiment, nitrogen atoms N are bound to silicon atoms Si in silicon substrate 301 positioned in contact part 303b between n-type impurity diffused region 303 and polycrystalline silicon film 304. It is possible to effectively suppress oxidation caused by oxygen caught therein from the outside air with the nitrogen atoms N in a case where polycrystalline silicon film 304 is formed with a conventional CVD apparatus. Hydrogen atoms H bound onto the nitrogen atoms N are the same ones as hydrogen atoms terminating silicon atoms Si on a surface of a normal silicon substrate.

Next, referring to FIGS. 15 to 20, a manufacturing process of the contact structure for interconnection according to the sixth embodiment will be described.

Figure 17:
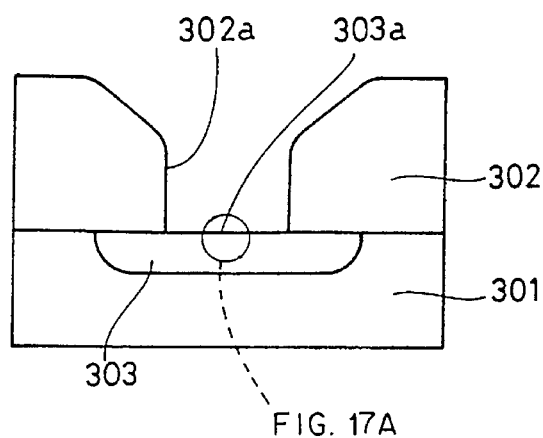
FIGS. 17 and 17A are a sectional view for explaining a first step of a manufacturing process of the contact structure for interconnection illustrated in FIG. 15.
Figure 17A:
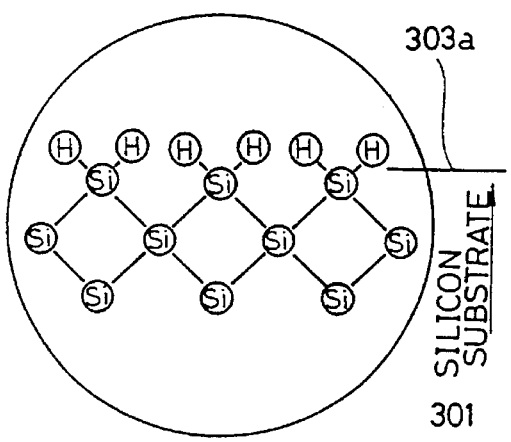
Figure 18:
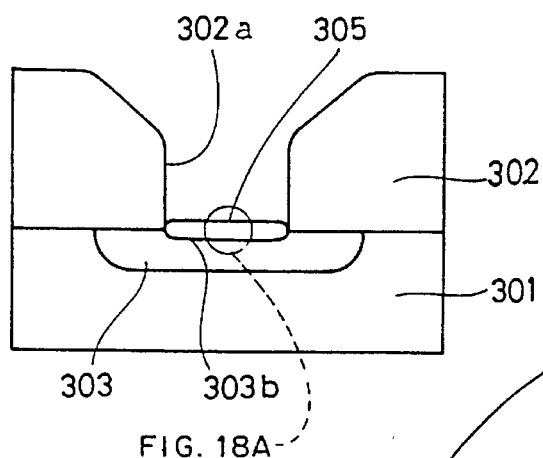
FIGS. 18 and 18A are a sectional view for explaining a second step of the manufacturing process of the contact structure for interconnection illustrated in FIG. 15.
Figure 18A:
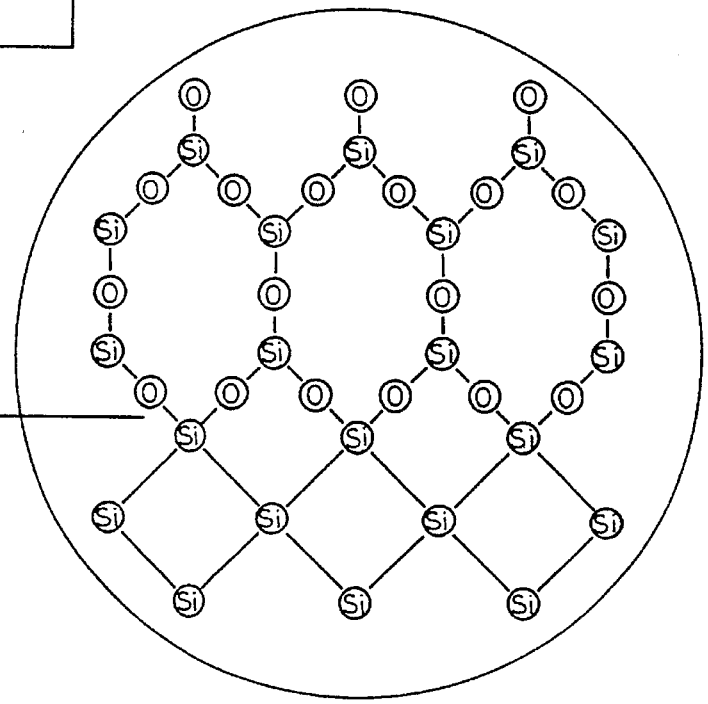

First, as illustrated in FIG. 17, an n-type impurity diffused region 303 is formed in a predetermined region on a surface of a silicon substrate 301. An insulating oxide film 302 is formed on the whole surface of silicon substrate 301. A contact hole 302a is formed in a region of insulating oxide film 302 positioned on n-type impurity diffused region 303. Now, the atomic arrangement structure of the substrate surface 303a is in the same state as the state of a surface of a normal silicon substrate in which hydrogen atoms H are terminating silicon atoms Si positioned in the vicinity of substrate surface 303a. If substrate surface 303a is exposed by contact hole 302a, a natural oxide film 305 is formed in that part as illustrated in FIG. 18. This natural oxide film 305 is formed with a thickness of approximately 10Å at a normal temperature and a normal pressure. Now, the atomic arrangement in a boundary region 303b between natural oxide film 305 and n-type impurity diffused region 303 is of a structure as illustrated in FIG. 18. Specifically, oxygen atoms O are bound to silicon atoms Si positioned in the vicinity of boundary region 303b, and silicon atoms Si are bound to the oxygen atoms O. This structure is disclosed in NIKKEI - MICRODEVICES 1991. 2. pp 56–58.

Figure 19:
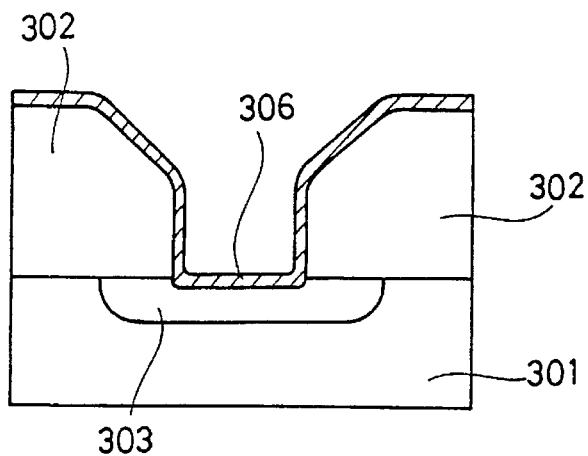
FIG. 19 is a sectional view for explaining a third step of the manufacturing process of the contact structure for interconnection illustrated in FIG. 15.

Then, as illustrated in FIG. 19, natural oxide film 305 is thermally nitrided at a high speed to form a nitrided oxide film 306.

Figure 20:
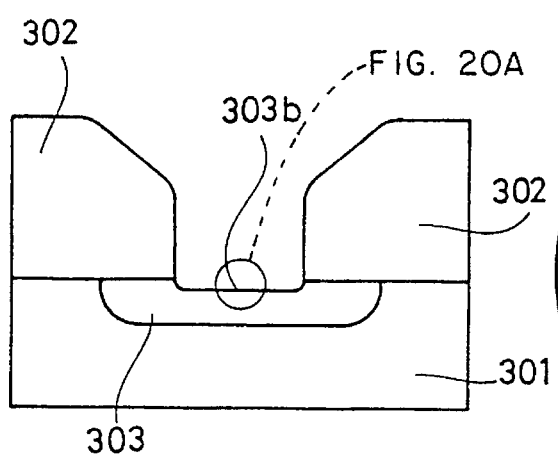
FIGS. 20 and 20A are a sectional view for explaining a fourth step of the manufacturing process of the contact structure for interconnection illustrated in FIG. 15.
Figure 20A:
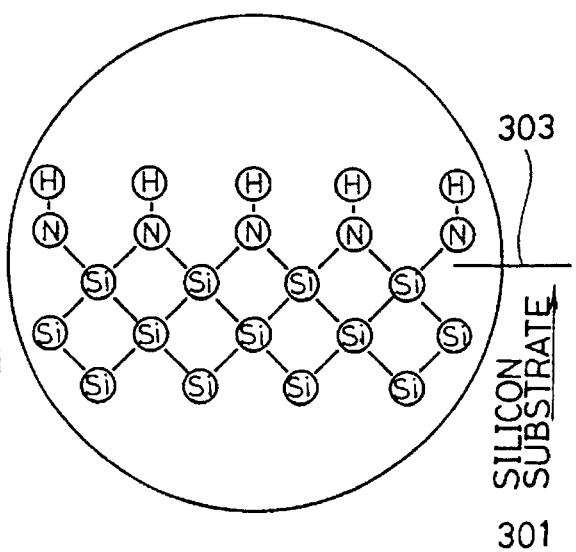

Then, as illustrated in FIG. 20, the formed nitrided oxide film 306 is removed using an HF solution and high purity water cleaning, for example. Now, the atomic arrangement of boundary region 303b in this state is of a structure in which nitrogen atoms N are bound onto silicon atoms Si in the vicinity of boundary region 303b, and hydrogen atoms H are bound onto the nitrogen atoms. Specifically, it is a structure in which nitrogen atoms N are arranged in the shape of a layer. A polycrystalline silicon film 304 is formed on boundary region 303b in such a state by using a conventional CVD apparatus as illustrated in FIG. 15. Now, when polycrystalline silicon film 304 is formed with a conventional CVD apparatus, oxidation due to oxygen caught therein is generated as in the case of the conventional process. However, since a layer including nitrogen atoms N is formed in boundary region 303b, oxygen atoms O are effectively prevented from being bound to silicon atoms Si in silicon substrate 301. The reason why it is possible to suppress invasion of oxygen O with nitrogen atoms N in this embodiment is that the bond energy is increased, as compared with the conventional structure in which hydrogen atoms H terminate silicon atoms Si, by interposing nitrogen atoms N between hydrogen atoms H and silicon atoms Si and binding the nitrogen atoms N to the hydrogen atoms H and to the silicon atoms Si, respectively. Specifically, while the bond energy of hydrogen atoms H and silicon atoms Si is 71 Kcal/mol in the conventional atomic arrangement structure, it is bond energy of 180 Kcal/mol of the sum of the bond energy of 75 Kcal/mol of hydrogen atoms H and nitrogen atoms N and the bond energy of 105 Kcal/mol of nitrogen atoms N and silicon atoms Si in the sixth embodiment. Specifically, it is necessary for oxygen atoms O to invade with energy exceeding the bond energy of 180 Kcal/mol in this embodiment. Therefore, according to this embodiment, it is possible to effectively prevent invasion of oxygen atoms O as compared with the case of the conventional process. Accordingly, generation of a natural oxide film is inhibited. As a result, the variance of the contact resistance can be made small, and the contact resistance can be lowered.

Figure 21:
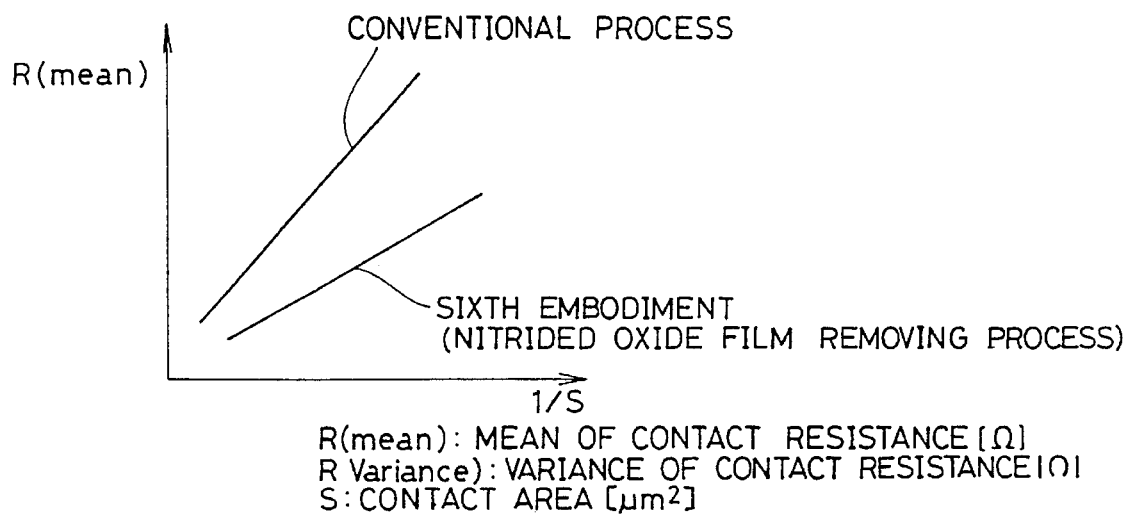
FIG. 21 is a characteristic graph in which the conventional process and a process according to the sixth embodiment of the present invention are compared in respect of the relation between the contact area and the mean of the contact resistance.
Figure 22:
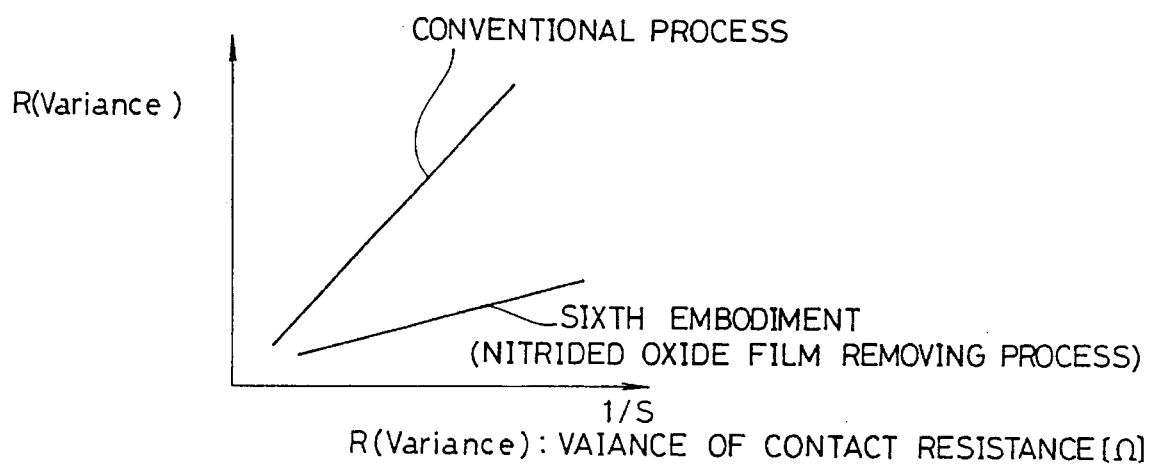
FIG. 22 is a characteristic graph in which the conventional process and the process according to the sixth embodiment of the present invention are compared in respect of the relation between the contact area and the variance of the contact resistance.
Figure 23:
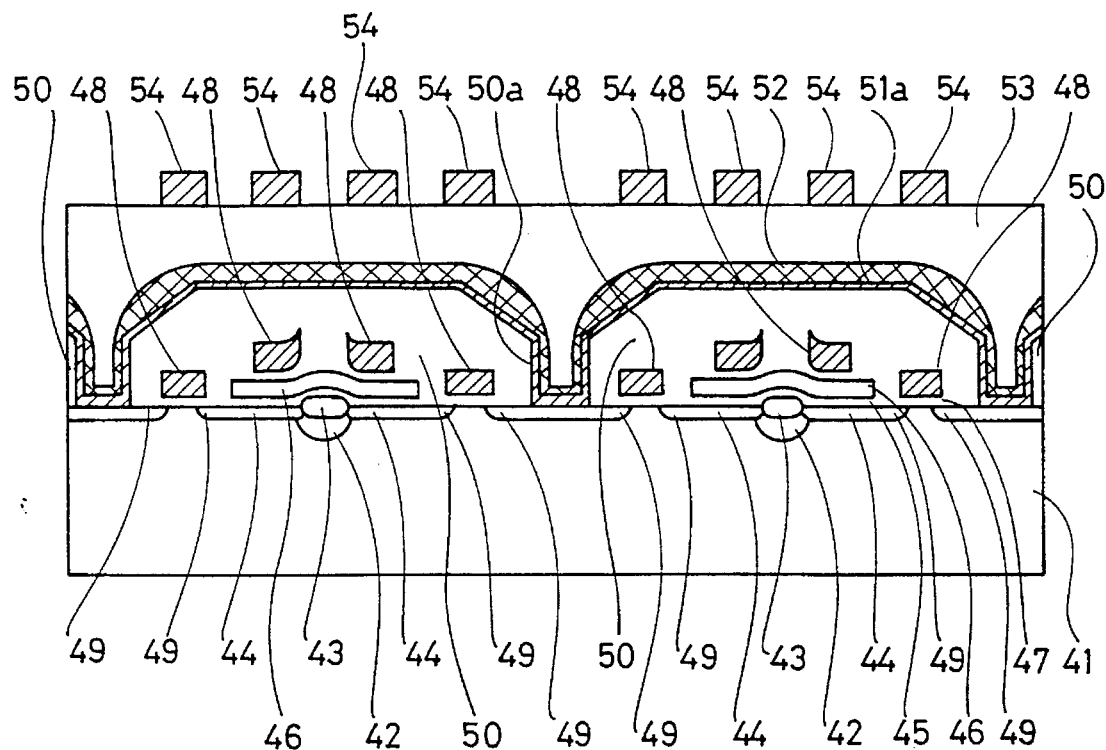
FIG. 23 is a sectional structure view for describing a contact structure for interconnection in a conventional DRAM.
Figure 24:
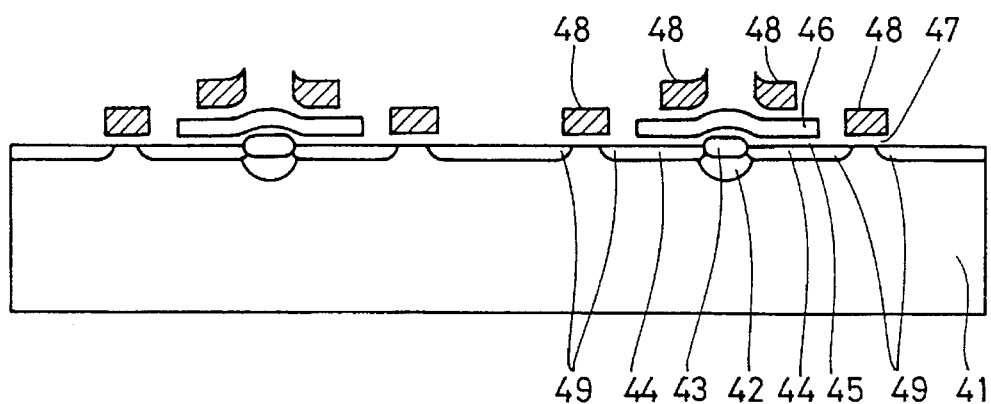
FIG. 24 is a sectional view for describing a first step of a manufacturing process of the conventional DRAM illustrated in FIG. 23.
Figure 25:
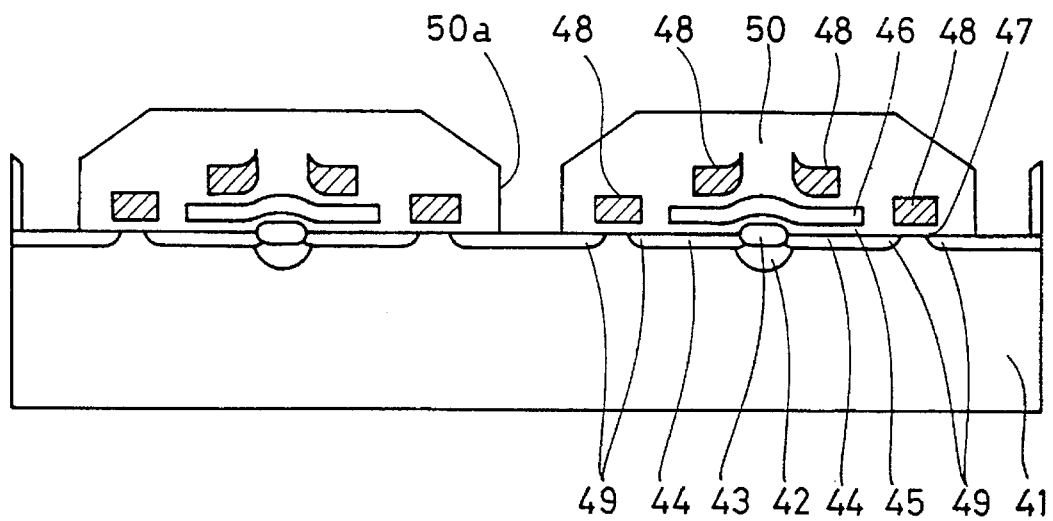
FIG. 25 is a sectional view for describing a second step of the manufacturing process of the conventional DRAM illustrated in FIG. 23.
Figure 26:
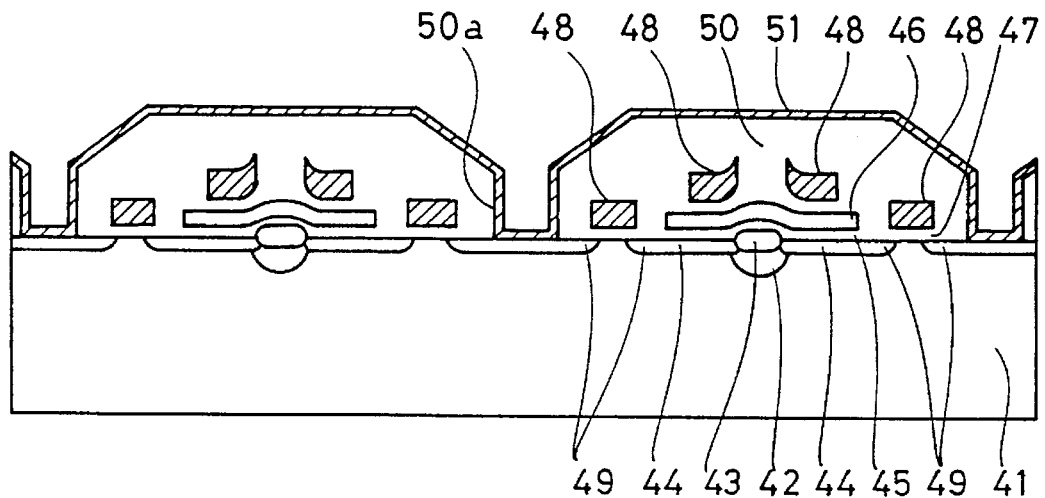
FIG. 26 is a sectional view for describing a third step of the manufacturing process of the conventional DRAM illustrated in FIG. 23.
Figure 27:
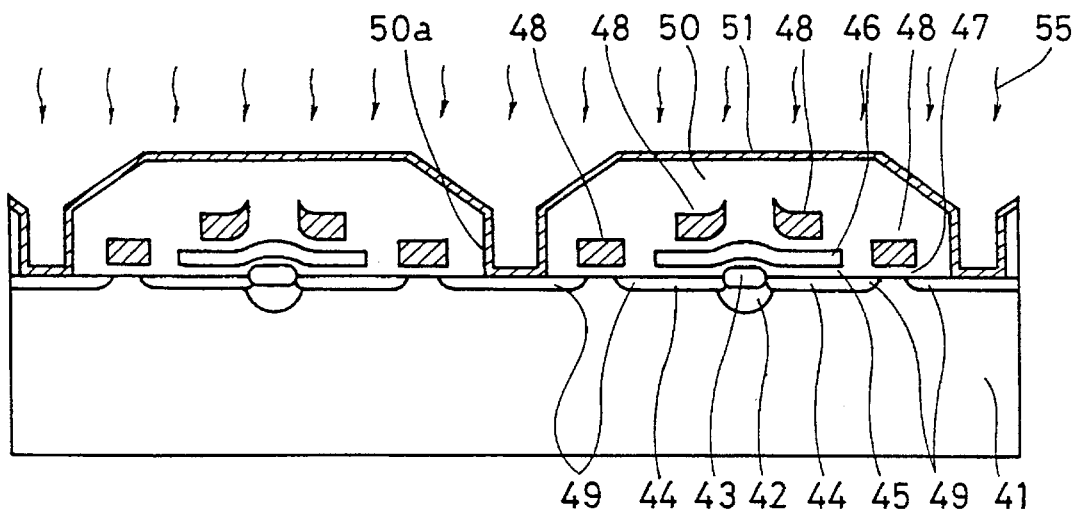
FIG. 27 is a sectional view for describing a fourth step of the manufacturing process of the conventional DRAM illustrated in FIG. 23.

FIG. 21 is a characteristic graph in which the conventional process and the process according to the sixth embodiment are compared with respect to the relation between the contact area and the mean of the contact resistance. FIG. 22 is a characteristic graph in which the conventional process and the process according to the sixth embodiment are compared with respect to the relation between the contact area and the variance of the contact resistance. Referring to FIGS. 21 and 22, 1/the contact area S ($\mu m^2$) is indicated on the abscissa, and the mean or the variance ($\Omega$) of the contact resistance is indicated on the ordinate. Now, referring to FIG. 21 first, the mean of the contact resistance is increased as the contact area becomes smaller. In the conventional manufacturing process, a thick oxide film is formed between a polycrystalline silicon film and an impurity region connected to the polycrystalline silicon film because of oxidation caused by oxygen caught therein or the temperature (400° C.–700° C.) in a CVD apparatus when the polycrystalline silicon film is formed by a CVD process. As a result, the contact resistance is increased. This tendency becomes more noticeable as the contact area becomes smaller. Therefore, in the conventional process, the rate of increase of the contact resistance in accordance with reduction in the contact area S is high. On the other hand, according to the process of the sixth embodiment of the present invention including the step of removing the above-described nitrided oxide film, the presence of a layer including nitrogen atoms N can suppress the above-described oxidation caused by oxygen caught therein and the heat in the CVD apparatus. Therefore, according to the sixth embodiment, it is possible to lower the contact resistance as compared with the case of the conventional process. In addition, it is possible to lower the rate of increase in the mean of the contact resistance in accordance with reduction in the contact area S as compared with the case of the conventional process.

Next, referring to FIG. 22, as for the variance of the contact resistance, there are variations in the thickness of an oxide film formed by the conventional process for the reason that the amount of oxygen caught in a CVD apparatus during formation of a polycrystalline silicon film is unstable or the like. The variations become particularly noticeable if the contact area becomes smaller. Specifically, the rate of increase in the variance of the contact resistance in accordance with reduction in the contact area S is high in the case of the conventional process. On the other hand, according to the sixth embodiment, the above-described oxidation caused by oxygen caught therein or high temperature in a CVD apparatus is suppressed by nitrogen atoms N bound to silicon atoms Si on the surface of a silicon substrate, so that the thickness of a formed oxide film also becomes smaller, and variations in the thickness of it also become smaller. Accordingly, it is also possible to lower the rate of increase in the variance of the contact resistance in accordance with reduction in the contact area S.

As described above, in a semiconductor device according to an embodiment of the present invention, a nitrided oxide film having a thickness sufficient for a tunnel current to flow is interposed between a first conductive layer and a second conductive layer, so that formation of a thick oxide film between the first conductive layer and the second conductive layer is effectively prevented. As a result, it is possible to obtain satisfactory ohmic contact between the first conductive layer and the second conductive layer. In addition, the nitrided oxide film effectively prevents impurities in the first conductive layer and impurities in the second conductive layer from being diffused to each other, so that it is possible to effectively prevent variations in the impurity concentration in the first conductive layer.

In a semiconductor device according to another aspect of the present invention, an insulating layer is formed on a first conductive layer to expose a contact part of the first conductive layer, a second conductive layer is formed to at least fill the opening, and a thin film formed of material having a thickness sufficient to prevent impurities from flowing between the first conductive layer and the second conductive layer as well as to establish ohmic contact between the first conductive layer and the second conductive layer is interposed between the first conductive layer and the second conductive layer in the opening, so that impurities in the first conductive layer and impurities in the second conductive layer are effectively prevented from being diffused to each other, and it is possible to effectively prevent variations in the impurity concentration in the first conductive layer.

In a method of manufacturing a semiconductor device according to the present invention, a natural oxide film is formed on a first conductive layer, the natural oxide film is processed to form a processed oxide film having a thickness sufficient to prevent impurities from flowing between the first conductive layer and a second conductive layer as well as to establish ohmic contact between the first conductive layer and the second conductive layer, and the second conductive layer in contact with the first conductive layer through the processed oxide film is formed, so that it is possible to effectively prevent diffusion of impurities between the first and second conductive layers in a later heat treatment process. In addition, if a nitrided oxide film is used as the processed oxide film, it is possible to effectively prevent growth of an oxide film between the first conductive layer and the second conductive layer even in a case where a heat treatment process is carried out in an atmosphere of oxygen in a later process.

In a semiconductor device according to still another aspect of the present invention, a layer including nitrogen atoms is formed in a contact part between a first conductive layer and a second conductive layer, so that it is possible to suppress oxidation caused by oxygen caught in a CVD apparatus or heat in the CVD apparatus during formation of the second conductive layer with the layer including nitrogen atoms.

In a method of manufacturing a semiconductor device according to a further aspect of the present invention, a natural oxide film formed on a first conductive layer is nitrided to form a nitrided oxide film, the nitrided oxide film is removed, and a second conductive layer is formed, so that a layer including nitrogen atoms is formed on the surface of the first conductive layer from which the nitrided oxide film is removed, and it is possible to effectively prevent oxidation in a later process with the layer including nitrogen atoms.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A contact structure in a semiconductor device, comprising:

first and second conductive layers in contact with each other through a nitrided oxide film of a thickness sufficient to enable direct tunnel current flow therethrough, wherein said thickness of said nitrided oxide film allows said first conductive layer and said second conductive layer to be in ohmic contact.

2. In a semiconductor device, a contact structure comprising:

a first conductive layer;

an insulating layer provided on said first conductive layer, having a contact opening formed therethrough to expose a contact portion of said first conductive layer;

a second conductive layer provided on said insulating layer, disposed to fill at least a portion of said contact opening; and a thin film of material inhibiting flow of impurities between said first and second conductive layers within said contact opening, said film being of a thickness sufficient to enable direct tunnel current flow therethrough and allow ohmic contact between said first and second conductive layers.

3. A contact structure between two conductive layers in a semiconductor device, comprising:

a first conductive layer;

an insulating layer formed on said first conductive layer to have an opening on said first conductive layer;

a nitrided oxide film formed to be in contact with at least said first conductive layer in said opening; and a second conductive layer formed on said nitrided oxide film to be in contact with said nitrided oxide film, wherein said nitrided oxide film has a thickness sufficient to enable direct tunnel current flow therethrough and allow said first conductive layer and second conductive layer to be in ohmic contact.

4. The semiconductor device according to claim 2, wherein:

said nitrided oxide film has a thickness not greater than 20Å.

5. The contact structure according to claim 1, wherein:

said second conductive layer includes a polycrystalline silicon layer doped with impurities and formed on said nitrided oxide film.

6. The contact structure according to claim 5, wherein:
said second conductive layer includes a silicide layer formed on said polycrystalline silicon layer.

7. The contact structure according to claim 1, wherein:
said first conductive layer includes an impurity region formed on a main surface of a semiconductor substrate.

8. The contact structure according to claim 1, wherein:
said first conductive layer includes a polycrystalline silicon layer.

9. The contact structure according to claim 1, wherein:
said nitrided oxide film includes a silicon nitrided oxide film.

10. The contact structure according to claim 7, wherein:
said silicon nitrided oxide film has a composition of

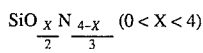

11. A contact structure between two conductive layers in a semiconductor device, comprising:
a first conductive layer;
a first insulating layer formed on said first conductive layer to have a first opening on said first conductive layer;
a first nitrided oxide film formed at least on said first conductive layer in said first opening;
a second conductive layer formed on said first nitrided oxide film;
a second insulating layer formed on said second conductive layer to have a second opening on said second conductive layer;
a second nitrided oxide film formed at least on said second conductive layer in said second opening; and
a third conductive layer formed on said second nitrided oxide film,
wherein each of said first and second nitrided oxide films has a thickness sufficient to enable direct tunnel current flow therethrough and allow adjacent ones of the first, second and third conductive layers on and under said first and second nitrided oxide films to be in respective ohmic contact.

12. A semiconductor memory device, comprising:
a substrate having a major surface;
a pair of impurity regions forming source and drain regions spaced apart from each other in said major surface of said substrate, a channel region being formed between said impurity regions;
a gate electrode overlying said channel region through a gate insulating film;
a charge storage capacitor electrode overlying one of said pair of impurity regions through a capacitor dielectric layer;
an insulating film covering said substrate and containing a contact opening exposing the other one of said pair of impurity regions; and
a bit line overlying said insulating film and in contact with said impurity region through said contact opening;
said bit line comprising a conductive layer in electrical contact with said impurity region through a thin film of a material inhibiting flow of impurities between said conductive layer and said impurity region, said material being of a thickness sufficient to enable direct tunnel current flow therethrough and allow ohmic contact between said conductive layer and said impurity region.

13. The semiconductor memory device according to claim 12, wherein:
said thin film is a nitrided oxide film.

14. A semiconductor memory device, comprising:
a substrate having a major surface;
a pair of impurity regions forming source and drain regions spaced apart from each other in said major surface of said substrate, a channel region being formed between said impurity regions;
a gate electrode overlying said channel region through a gate insulating film;
a charge storage capacitor electrode in contact with one of said pair of impurity regions;
an insulating film covering said substrate and containing a contact opening exposing the other one of said pair of impurity regions; and
a bit line overlying said insulating film and in contact with said impurity region through said contact opening;
said charge capacitor electrode comprising a conductive layer in contact with said impurity region through a thin film of a material inhibiting flow of impurities between said conductive layer and said impurity region, said thin film being of a thickness sufficient to enable direct tunnel current flow therethrough and allow ohmic contact between said conductive layer and said impurity region.

15. The semiconductor memory device according to claim 14, wherein:
said thin film is a nitrided oxide film.

16. The contact structure according to claim 11, wherein:
said nitrided oxide film has a thickness which allows said first conductive layer and second conductive layer to be in ohmic contact.

17. A semiconductor memory device, comprising:
a first conductive layer;
a second conductive layer in contact with said first conductive layer; and
a layer of a material including nitrogen atoms formed in a contact part between said first conductive layer and said second conductive layer and having a thickness sufficient to enable direct tunnel current therethrough and allow ohmic contact between the first and second conductive layers.

* * * * *